United States Patent
Ishikawa et al.

(10) Patent No.: US 6,373,774 B2
(45) Date of Patent: Apr. 16, 2002

(54) SEMICONDUCTOR MEMORY DEVICE WITH BANK CONFIGURATION

(75) Inventors: Masatoshi Ishikawa; Katsumi Dosaka, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/773,710

(22) Filed: Feb. 2, 2001

(30) Foreign Application Priority Data

May 29, 2000 (JP) .......................................... 12-158219

(51) Int. Cl.[7] .................................................. G11C 8/00
(52) U.S. Cl. ............................ 365/230.03; 365/230.08; 365/230.06; 365/230.01
(58) Field of Search ........................ 365/230.03, 230.06, 365/230.09, 230.08, 200, 239, 189.04, 230.01

(56) References Cited

U.S. PATENT DOCUMENTS 6,229,752 B1 * 5/2001 Ayukawa et al. ...... 365/230.03

FOREIGN PATENT DOCUMENTS

JP 361097846 A * 5/1986 ............ H01L/21/82
JP 11-110963 4/1999

OTHER PUBLICATIONS

"A 5.3–GB/s Embedded SDRAM Core with Slight–Boost Scheme", Akira Yamazaki et al., IEEE Journal of SolidState Circuits, vol. 34, No. 5, May 1999, pp. 661–669.

"A Configurable DRAM Macro Design for 2112 Derivative Organizations to be Synthesized Using a Memory Generator", Tomoaki Yabe et al., IEEE Journal of Solid–State Circuits, vol. 33, No. 11, Nov. 1998, pp. 1752–1757.

* cited by examiner

Primary Examiner—David Nelms
Assistant Examiner—David Lam
(74) Attorney, Agent, or Firm—McDermott, Will & Emery

(57) ABSTRACT

The semiconductor memory device includes a logic circuit and a memory macro. The memory macro has a region in which memory blocks are formed. Memory spaces are increased in a predetermined order. Address connection lines connecting between the logic circuit and the memory macro alter a connecting relation such that consecutive addresses are realized in each bank. A word line address specified by the logic circuit is used in the memory macro with no change therein.

5 Claims, 29 Drawing Sheets

FIG. 2

| | | | | |
|---|---|---|---|---|
| m0 | (1) | /intRA9 | /intRA10 | /intRA12 |
| m1 | (9) | intRA9 | /intRA10 | |
| m2 | (5) | /intRA9 | /intRA10 | /intRA11 |
| | (13) | intRA9 | intRA10 | |
| m4 | (3) | /intRA9 | /intRA10 | |
| m5 | (11) | intRA9 | /intRA10 | /intRA11 |
| m6 | (7) | /intRA9 | intRA10 | |
| | (15) | intRA9 | intRA10 | intRA11 |
| m8 | (2) | /intRA9 | /intRA10 | intRA12 |
| m9 | (10) | intRA9 | /intRA10 | |
| m10 | (6) | /intRA9 | intRA10 | /intRA11 |
| | (14) | intRA9 | intRA10 | |
| m12 | (4) | /intRA9 | /intRA10 | |
| m13 | (12) | intRA9 | /intRA10 | intRA11 |
| m14 | (8) | /intRA9 | intRA10 | |
| | (16) | intRA9 | intRA10 | |

FIG. 4

| ADDRESS IN MEMORY MACRO | ADDRESS ON LOGIC CIRCUIT SIDE | | |
|---|---|---|---|
| | 1-BANK | 2-BANK | 4-BANK |
| intRA9 | RA12 | RA11 | RA10 |
| intRA10 | RA11 | RA10 | RA9 |
| intRA11 | RA10 | RA9 | BA0 |
| intRA12 | RA9 | BA0 | BA1 |

FIG. 8

| ROW ADDRESS IN HEXADECIMAL NOTATION | RA0~RA8 | | | |
|---|---|---|---|---|
| 0000 – 01FF | m0 | /RA12 | /RA11 | /RA10 |
| 1000 – 11FF | m1 | RA12 | /RA11 | /RA10 |
| 0800 – 09FF | m2 | /RA12 | RA11 | /RA10 |
| (1800) – (19FF) | //////// | RA12 | RA11 | /RA10 |
| 0400 – 05FF | m4 | /RA12 | /RA11 | RA10 |
| 1400 – 15FF | m5 | RA12 | /RA11 | RA10 |
| 0C00 – 0DFF | m6 | /RA12 | RA11 | RA10 |
| (1C00) – (1DFF) | //////// | RA12 | RA11 | RA10 |
| 0200 – 03FF | m8 | /RA12 | /RA11 | /RA10 |
| 1200 – 13FF | m9 | RA12 | /RA11 | /RA10 |
| 0A00 – 0BFF | m10 | /RA12 | RA11 | /RA10 |
| (1A00) – (1BFF) | //////// | RA12 | RA11 | /RA10 |
| 0600 – 07FF | m12 | /RA12 | /RA11 | RA10 |
| 1600 – 17FF | m13 | RA12 | /RA11 | RA10 |
| 0E00 – 0FFF | m14 | /RA12 | RA11 | RA10 |
| (1E00) – (1FFF) | //////// | RA12 | RA11 | RA10 |

The rightmost column spans as /RA9 for the top 8 rows and RA9 for the bottom 8 rows.

1-BANK CONFIGURATION

4-BANK CONFIGURATION

FIG. 14

| ADDRESS IN MEMORY MACRO | LOGIC CIRCUIT SIDE ADDRESS ||
|---|---|---|
| | 2-BANK | 4-BANK |
| intRA9 | BA0 | BA1 |
| intRA10 | RA11 | BA0 |
| intRA11 | RA10 | RA10 |
| intRA12 | RA9 | RA9 |

FIG. 17

| | ROW ADDRESS IN HEXADECIMAL NOTATION | RA0~RA8 | | | | |
|---|---|---|---|---|---|---|
| B0 | 000 – 1FF | m0 | /BA0 | /RA11 | /RA10 | /RA9 |
| B1 | 000 – 1FF | m1 | BA0 | | | |
| B0 | 200 – 3FF | m2 | /BA0 | RA11 | | |
| B1 | 200 – 3FF | m3 | BA0 | | | |
| B0 | 400 – 5FF | m4 | /BA0 | /RA11 | RA10 | |
| B1 | 400 – 5FF | m5 | BA0 | | | |
| B0 | 600 – 7FF | m6 | /BA0 | RA11 | | |
| B1 | 600 – 7FF | m7 | BA0 | | | |
| B0 | 800 – 9FF | m8 | /BA0 | /RA11 | /RA10 | RA9 |
| B1 | 800 – 9FF | m9 | BA0 | | | |
| B0 | A00 – BFF | m10 | /BA0 | RA11 | | |
| B1 | A00 – BFF | m11 | BA0 | | | |
| B0 | C00 – DFF | m12 | /BA0 | /RA11 | RA10 | |
| B1 | C00 – DFF | m13 | BA0 | | | |
| B0 | E00 – FFF | m14 | /BA0 | RA11 | | |
| B1 | E00 – FFF | m15 | BA0 | | | |

1-BANK CONFIGURATION

2-BANK CONFIGURATION

4-BANK CONFIGURATION

1-BANK CONFIGURATION

2-BANK CONFIGURATION

4-BANK CONFIGURATION

SEMICONDUCTOR MEMORY DEVICE WITH BANK CONFIGURATION

BACKGROUND OF THE INVENTION

1. Field of the Invention

The present invention relates to a semiconductor memory device and particularly, to addressing in a case where a memory and a logic circuit are integrally formed on one chip.

2. Description of the Background Art

In design of an embedded dynamic random access memory that is constructed of a memory and a logic circuit driving the memory on one chip, a designer keeps on hand memory macros ready to use in which the number of bits in an array and the number of banks can be varied, in order to response to many requirements.

Description will be given of a conventional embedded memory macro using FIG. 21. A memory macro shown in FIG. 21 has a 4-bank configuration each bank of which has a memory capacity of 8 Mbits and realizes a total memory capacity of 32 Mbits. A bank B0 is constructed of blocks B0a and B0b disposed on both sides of a central control band 900. Likewise, banks B1, B2 and B3 are constructed of pairs of blocks, B1a and B1b; B2a and B2b; and B3a and B3b, respectively disposed both sides of the central control band 900. Each bank includes a plurality of memory cells M disposed in a matrix arrangement; a plurality of word lines (WL) disposed in correspondence to a plurality of rows and a plurality of bit lines (BL) disposed in correspondence to a plurality of columns. It should be appreciated that, in an example shown in FIG. 21, each block has 512 word lines.

In the central control band 900, a signal line 902 is disposed for transmission of an address. The signal line 902 transmits a signal output from an address buffer 904. A row decoder 906 performs row selection according to an output of the signal line 902.

The banks B0, B1, B2 and B3 are configured such that four 2-Mbit memory blocks are stacked. A memory capacity can be adjusted in memory blocks of 2 Mbits as a unit.

Further, the bank configuration is not limited to the 4-bank configuration but there can also be adopted a 2-bank configuration in which the entire memory blocks are grouped into two banks or a 1-bank configuration in which the entire memory blocks are used as one bank.

In each memory block, a redundant word line is disposed. Any defective word line can be replaced with a redundant word line not only in a memory block in which the redundant word line is disposed, but also in any of 4 memory blocks in the same bank in which the redundant word line is disposed.

In this configuration, a row address specifying a row direction, input externally, is latched at an address buffer 904 and sent to the signal line 902 disposed in the central control band 900 at a proper timing. At this time, part of the row address is predecoded. The row address 906 is sent from the signal line 902 running through the central control band 900. A signal received from the signal line 902 is decoded by the row decoder 906.

A word line WL is activated by the row decoder 906. Furthermore, a memory cell M is selected according to a column address, input externally. When a read operation is specified by the logic circuit, a data on a selected memory cell is output to the logic circuit. When a write operation is specified by the logic circuit, a data received from the logic circuit side is written onto a selected memory cell.

Description will be given of an address map for a row address in a memory macro with such a configuration. In the figure, RA0 to RA12 indicates respective row address signals, and BA0 to BA1 indicates respective bank address signals. A mark "/" means inversion. For example, when /RA12 is at H level if the row address signal RA12 is at L level. Further, m0 to m15 indicates memory blocks.

Referring to FIG. 22, in a 1-bank configuration, the row address signals RA9 to RA12 are used in order to specify a memory block. The memory block m0 is selected by activating the row address signals /RA12, /RA11, /RA10 and /RA9; the memory block m1 is selected by activating the row address signals /RA12, /RA11, /RA10 and RA9; the memory block m2 is selected by activating the row address signals /RA12, /RA11, RA10 and /RA9; and the memory block m3 is selected by activating the row address signals /RA12, /RA11, RA10 and RA9.

The memory block m4 is selected by activating the row address signals /RA12, RA11, /RA10 and /RA9; the memory block m5 is selected by activating the row address signals /RA12, RA11, /RA10 and RA9; the memory block m6 is selected by activating the row address signals /RA12, RA11, RA10 and /RA9; and the memory block m7 is selected by activating the row address signals /RA12, RA11, RA10 and RA9.

The memory block m8 is selected by activating the row address signals RA12, /RA11, /RA10 and /RA9; the memory block m9 is selected by activating the row address signals RA12, /RA11, /RA10 and RA9; the memory block m10 is selected by activating the row address signals RA12, /RA11, RA10 and /RA9; and the memory block m11 is selected by activating the row address signals RA12, /RA11, RA10 and RA9.

The memory block m12 is selected by activating the row address signals RA12, RA11, /RA10 and /RA9; the memory block m13 is selected by activating the row address signals RA12, RA11, /RA10 and RA9; the memory block m14 is selected by activating the row address signals RA12, RA11, RA10 and /RA9; and the memory block m15 is selected by activating the row address signals RA12, RA11, RA10 and RA9.

Referring to FIG. 23, in a 2-bank configuration, a bank address signal BA0 is assigned onto a signal line on which the row address signal RA12 has been assigned in the 1-bank configuration, and the bank address signal BA0 is used for switching-over between banks.

Referring to FIG. 24, in a 4-bank configuration, bank address signals BA0 and BA1 are assigned onto respective signal lines on which the row address signals RA11 and RA12 have been assigned in the 1-bank configuration, and the bank address signals BA0 and BA1 are used for switching-over between banks.

The row address signals RA0 to RA8 are used to specify word lines in a memory block regardless of a bank configuration.

In a case where a memory capacity of a memory macro in such a conventional memory chip is changed, a layout of a memory cell array is changed as shown in FIGS. 25 to 27. FIG. 25 corresponds to a 1-bank configuration, FIG. 26 corresponds to a 2-bank configuration; and FIG. 27 corresponds to a 4-bank configuration. In any case of the bank configurations, a memory capacity is of 24 Mbits. Portions shaded by hatching in the figure indicate regions where no layout configuration is present in a 24-Mbit configuration.

Referring to FIG. 25, in a case of the 1-bank configuration, a portion other than addresses "1800" to "1FFF" in hexadecimal notation (the hexadecimal notation is hereinafter applied) of row addresses "0000" to "1FFF" are an address space.

Referring to FIG. 26, in a case of the 2-bank configuration, portions other than addresses "F00" to "FFF" of row addresses "000" to "FFF" are address spaces.

Referring to FIG. 27, in a case of the 4-bank configuration, portions other than addresses "600" to "7FF" of row addresses "000" to "7FF" are address spaces.

In such a manner, in a case where the 1-bank configuration is realized with a memory capacity of 24 Mbits, 8 Mbits in an edge portion of a memory cell array of 32 M bits are removed from the memory cell array of 32 Mbits. Further, in a case where the 2-bank configuration is realized with a memory capacity of 24 Mbits, a total of 8 Mbits in central and edge portions of a memory cell array is removed from the memory cell array of 32 Mbits. Still further, in a case where the 4-bank configuration is realized with a memory capacity of 24 Mbits, 2 Mbits in each of 4 regions of a memory cell array of 32 Mbits, obtained by dividing the memory cell array are removed from the memory cell array.

While a region or regions which are removed in a memory cell array are in position different according to a bank configuration, this is because consecutive addresses in a bank is realized.

In such a conventional memory chip, there has arisen a problem described below in a case where different banks with the same layout as each other or one another are realized. For example, when address spaces of 2 banks are assigned in a layout of 1-bank configuration, as shown in FIG. 28; an address space of a bank B0 includes "000" to "FFF" and an address space of a bank B1 includes "000" to "EFF." Therefore, A memory space of 16 Mbits is assigned to the bank B0 and a memory space of 8 Mbits is assigned to the bank B1. That is, amounts of memory assignment to the respective banks are different from each other.

When an address space of the 1-bank configuration is assigned to a layout of 4-bank configuration, as shown in FIG. 29; an address space of the bank B0 includes "0000" to "05FF," "0800" to "0DFF," "1000" to "15FF," and "1800" to "1DFF." That is, parts of the address spaces are lost. Therefore, the address spaces become inconsecutive and fall into a state difficult to use for a user.

In this way, 1-, 2- and 4-bank configurations can be realized by replacing some of row addresses in a case of a memory capacity of 32 Mbits. Therefore, only one kind of a layout for a memory array is sufficient and different bank configurations can be realized with the same mask. However, if a memory cell array with different bank configurations is sought to be realized with the same mask while changing a memory capacity, an imbalance occurs in a memory space of each bank or inconsecutiveness arises in an address space.

Therefore, in a conventional practice, a different layout (different mask) has been necessary for each bank configuration as shown in FIGS. 25 to 27.

SUMMARY OF THE INVENTION

The present invention provides a semiconductor memory device being capable of realizing a consecutive memory space even when a bank configuration is altered, with the same mask.

A semiconductor memory device according to an aspect of the present invention includes: a memory macro including: a memory cell array region having a plurality of memory cells disposed in a matrix arrangement, a plurality of word lines disposed in correspondence to a plurality of rows, and a plurality of bit lines disposed in correspondence to a plurality of columns; and a select circuit for selecting a memory cell, a layout of the memory macro being determined according to a memory capacity; a logic circuit specifying operation of the memory macro; and an address connection line for transmitting an address to select a memory cell to the memory macro from the logic circuit, disposed between the logic circuit and the memory macro, wherein the address connection line is interconnected according to a bank configuration of the memory cell array region such that consecutiveness of an address space in a bank is maintained.

It is preferable that the plurality of memory cells are grouped into a plurality of memory blocks, the address include: a word line select address; and a block select address having a plurality of bits, the select circuit selects not only a memory block according to a block select address but also a specific word line included in the selected memory block according to a word line select address, and the address connection line is interconnected such that higher order bits of a block select address output from the logic circuit are assigned to lower order bits of the block select address in the memory macro, while lower order bits of the block select address output from the logic circuit are assigned to higher order bits of the block select address in the memory macro.

It is more preferable that the higher order bits of the block select address output from the logic circuit includes a bank address specifying a bank to be selected among a plurality of banks and the address connection line is interconnected such that in the memory macro, a bank address is assigned to the higher order bits of the block select address.

Particularly, each of the plurality of banks further includes a spare word line for substituting for a defective word line and the defective word line is replaced with the spare word line in a bank where the defective word line is present.

It is more preferable that the higher order bits of the block select address output from the logic circuit includes a bank address specifying a bank to be selected among a plurality of banks and the address connection line is interconnected such that in the memory macro, a bank address is assigned to the lower order bits of the block select address.

Particularly, each of the plurality of memory blocks further includes a spare word line for substituting for a defective word line and the defective word line is replaced with the spare word line in a memory block where the defective word line is present.

According to the semiconductor memory device relating to the present invention, consecutive memory spaces can be realized even in a case where different banks are realized with the same mask.

Hence, a mask is not necessary to make for each bank configuration. Further, since consecutive memory spaces can be realized, there is provided an environment that a user is easy to use.

Further, when the higher order bits and lower order bits of a block select address except a bank address are interchanged therebetween, a normal replacement operation is ensured in the memory macro having a redundancy configuration in which, in the same bank, a defective word line is replaced with a spare word line.

Further, when the higher order bits and lower order bits of a block select address except a bank address are interchanged therebetween, a normal replacement operation is ensured in a memory macro having a redundancy configuration in which, in the same memory block, a defective word line is replaced with a spare word line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is an illustration showing an example of layout configuration in the memory macro according to the first embodiment;

FIG. 4 is a table for describing an address mapping according to the first embodiment;

FIG. 8 is an illustration showing a layout configuration in a memory capacity of 24 Mbits and address spaces in the 1-bank configuration;

FIG. 14 is a table for describing an address mapping according to a second embodiment;

FIG. 17 is an illustration showing address spaces in the 2-bank configuration according to the second embodiment;

DESCRIPTION OF THE PREFERRED EMBODIMENTS

Description will be made of a semiconductor memory device according to embodiments of the present invention below using the accompanying drawings. The same constituents or corresponding constituents are indicated by the same marks and descriptions thereof are omitted, wherein a mark "/" means inversion.

First Embodiment

A memory chip in the first embodiment is described. The first embodiment is to realize a different bank configuration with the same mask for each memory capacity in a memory chip 1 on the same substrate of which a logic circuit 2 and a memory macro 3 are integrally formed.

Figure 1:
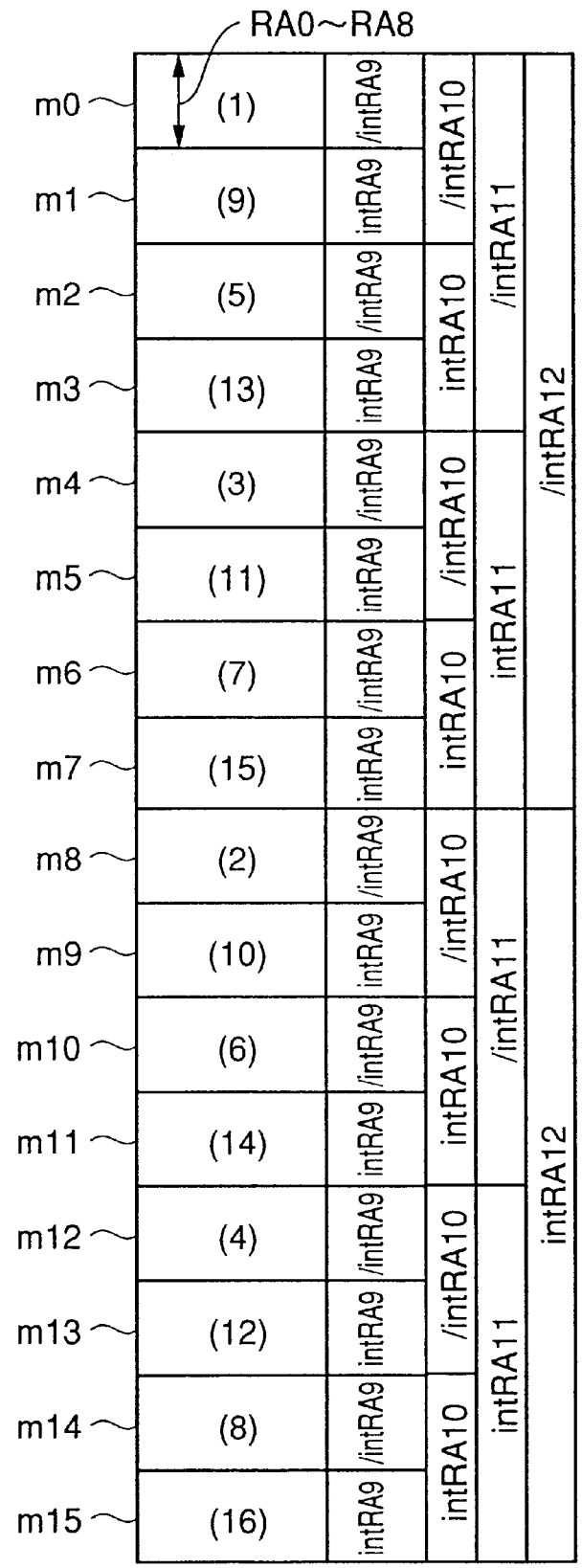
FIG. 1 is an illustration for describing an outline of a memory macro according to a first embodiment.

A relation between the memory macro 3 and the logic circuit 2 according to the first embodiment is described using FIG. 1. In the figure, intRAj (j=0 to 12) indicates a row address signal named based on physical interconnection in the memory macro 3. Raj (j=0 to 12) indicates a row address signal output to the memory macro 3 from the logic circuit 2.

Further, m0 to m15 indicates memory blocks constructing a memory region in the memory macro 3.

A bit string including row address signals intRA9 to intRA12 is hereinafter referred to as a block select address and a bit string including row addresses intRA0 to intRA8 (RA0 to RA8) is hereinafter referred to as a word line select address.

An intRAj with a larger j value is used as higher order bits, while one with a smaller j value is used as lower order bits.

In the memory macro 3, a memory block is selected based on the row address signals intRA9 to intRA12 and further a word line of the memory block that has been selected, is selected based on row address signals intRA0 to intRA8.

The row address signals intRA0 to intRA8 used to specify a word line in a memory block are used as the same names (RA0 to RA8), respectively, in the figure since the row address signals RA0 to RA8 output from the logic circuit 2 are used with no change therein.

A memory block m0 is selected by activating row address signals /intRA12, /intRA11, /intRA10 and /intRA9; a memory block m1 is selected by activating row address signals /intRA12, /intRA11, /intRA10 and intRA9; a memory block m3 is selected by activating row address signals /intRA12, /intRA11, intRA10 and hintRA9; and a memory block m3 is selected by activating row address signals /intRA12, /intRA11, intRA10 and intRA9.

A memory block m4 is selected by activating row address signals /intRA12, /intRA11, /intRA10 and /intRA9; a memory block m5 is selected by activating row address signals /intRA12, intRA11, /intRA10 and intRA9; a memory block m6 is selected by activating row address signals /intRA12, intRA11, intRA10 and /intRA9; and a memory block m7 is selected by activating row address signals /intRA12, intRA11, intRA10 and intRA9.

A memory block m8 is selected by activating row address signals intRA12, /intRA11, /intRA10 and /intRA9; a memory block m9 is selected by activating row address signals intRA12, /intRA11, /intRA10 and intRA9; a memory block m10 is selected by activating row address signals intRA12, /intRA11, intRA10 and /intRA9; and a memory block m11 is selected by activating row address signals intRA12, /intRA11, intRA10 and intRA9.

A memory block m12 is selected by activating row address signals intRA12, intRA11, /intRA10 and /intRA9; a memory block m13 is selected by activating row address signals intRA12, intRA11, /intRA10 and intRA9; a memory block m14 is selected by activating row address signals intRA12, intRA11, intRA10 and /intRA9; and a memory block m15 is selected by activating row address signals intRA12, intRA11, intRA10 and intRA9.

The numbers (1) to (16) attached to the memory blocks m0 to m15 indicate the order thereof in which a memory capacity is constructed. For example, in a case where a memory cell array of 24 Mbits is provided, the memory blocks numbered with (1) to (12) are used regardless of a bank configuration.

A concrete example of a layout configuration is shown in FIG. 2. In FIG. 2, portions shaded by hatching indicate regions in which no layout configuration is present. In a case where a memory capacity is of 24 Mbits, a memory block m0 to 2, m4 to m6, m8 to m10 and m12 to m14 are used as memory spaces.

The following memory blocks and respective parts of a row decoder for selecting the memory blocks are excluded from the layout: a memory block m3 and part of a row decoder for selecting the memory block m3 (part of the row decoder selected by the signal intRA9); a memory block m7 and part of the row decoder for selecting the memory block m7 (part of the row decoder selected by the signal intRA9); a memory block m11 and part of the row decoder for selecting the memory block m11 (part of the row decoder selected by the signal intRA9); and a memory block m15 and part of the row decoder for selecting the memory block m15 (part of the row decoder selected by the signal intRA9).

Array block control circuits other than a row decoder provided essentially for controlling a memory block are excluded from the layout: for example, a sense amplifier drive signal driver driving a sense amplifier drive signal for driving a sense amplifier amplifying a potential difference between bit lines constituting a pair, a column select line driver for selecting a column direction and the like.

In this way, one kind of layout (the same mask) is used for each memory capacity regardless of a bank configuration. A connecting relation between the memory macro 3 and the logic circuit 2 supplying a row address to the memory macro 3 is altered according to a bank configuration.

Figure 3:
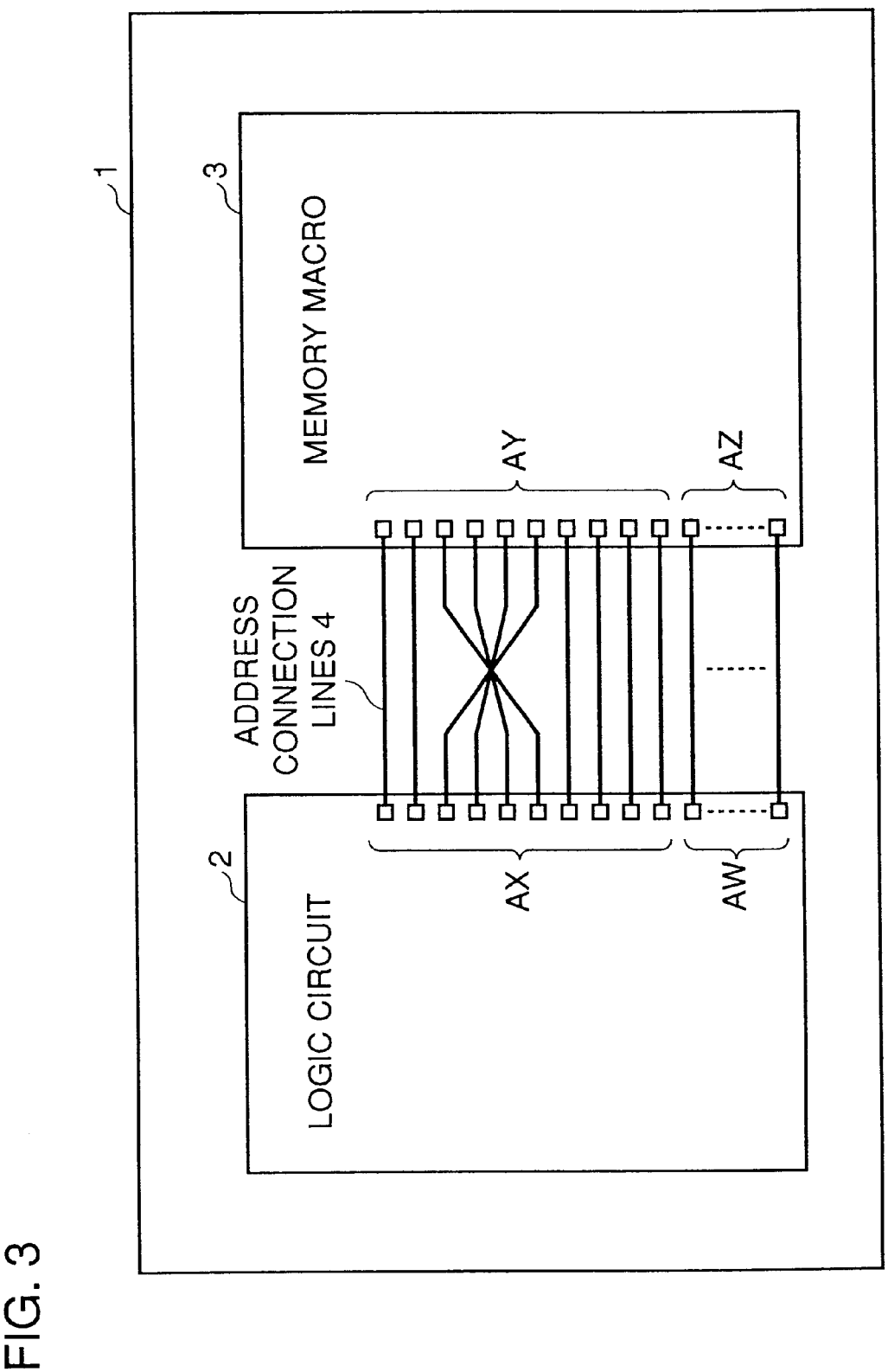
FIG. 3 is a diagram for describing address connection lines according to the first embodiment.
Figure 5:
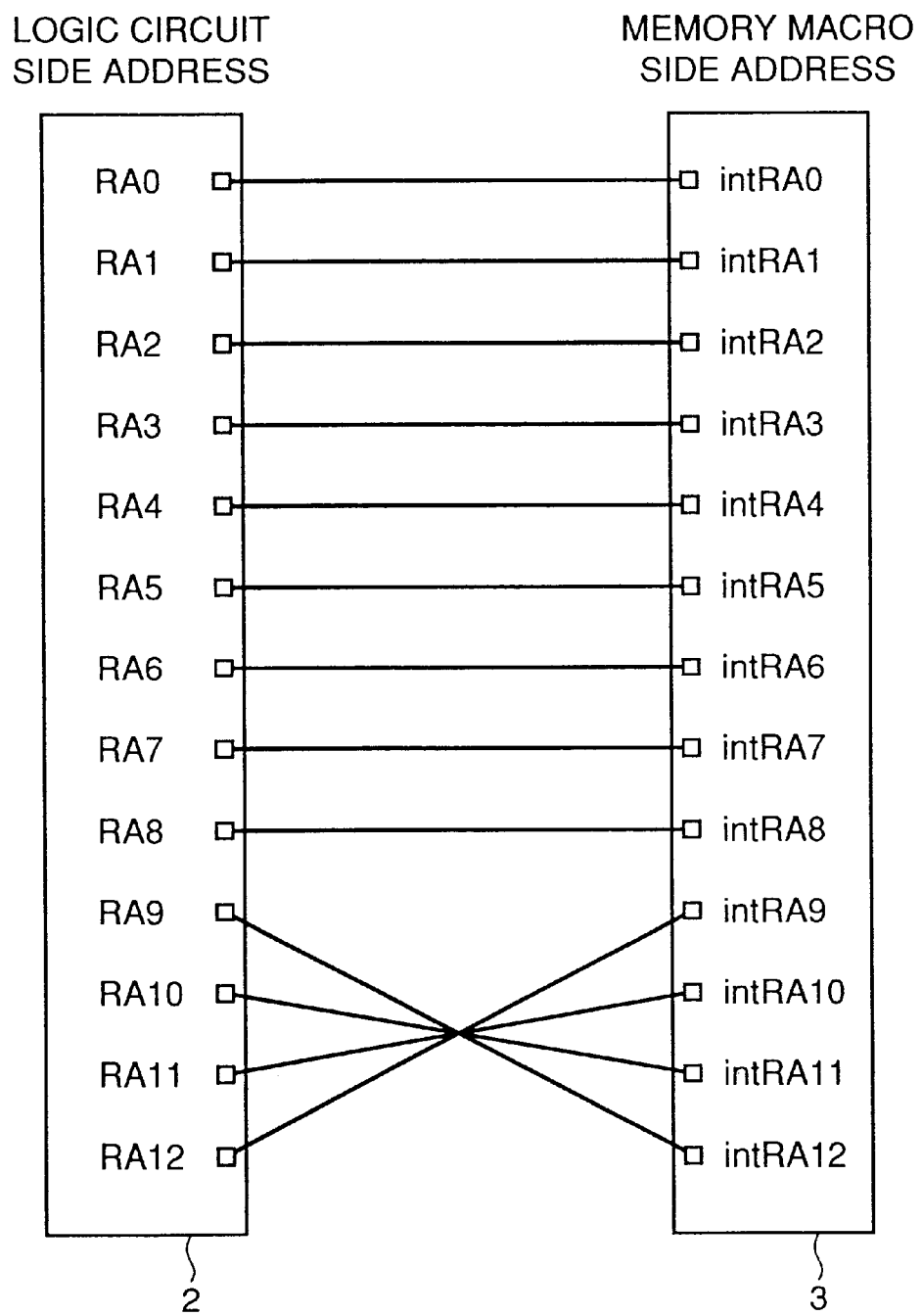
FIG. 5 is a diagram showing a connecting relation between a logic circuit 2 and a memory macro 3 in a 1-bank configuration.

The memory chip 1 according to the first embodiment, as shown in FIG. 3, includes the logic circuit 2, the memory macro 3 and address connection lines 4 connecting between the logic circuit 2 and the memory macro 3. The memory macro 3 receives address signals output from an address pin group AX of the logic circuit 2 through an address pin group AY. Furthermore, the memory macro 3 receives control signals from a pin group AW of the logic circuit 2 through a pin group AZ, or performs transmission/reception of a data with the logic circuit 2.

The address pin group AX of the logic circuit 2 and the address pin group AY of the memory macro 3 are connected to each other so as to satisfy a relation matching with a memory capacity.

A connecting relation is shown in FIGS. 4 and 5 to 7. In FIG. 4, there are shown signals assigned to an address intRAj and in FIGS. 5 to 7, a relation between an address pin of the logic circuit 2 and an address pin of the memory macro 3. The pins on the memory macro 3 side connected to interconnects over which row address signals intRA0 to intRA12 are transmitted are referred to as address pins intRA0 to intRA12, respectively. The pins on the logic circuit 2 side outputting the row address signals RA0 to RA12, and bank address signals BA0 and BA1 are referred to as address pins RA0 to RA12, BA0 and BA1, respectively.

Referring to FIG. 4, in a 1-bank configuration, the row address signals RA12, RA11, RA10 and RA9 are assigned as row address signals intRA9, intRA10, intRA11 and intRA12, respectively.

To be detailed, the address pins intRA9, intRA10, intRA11 and intRA12 are connected to the address pins RA12, RA11, RA10 and RA9, respectively.

Referring to FIG. 4, in a 2-bank configuration, the row address signals RA11, RA10 and RA9, and the bank address BA0 are assigned as the row address signals intRA9, intRA10, intRA11 and intRA12, respectively.

Figure 6:
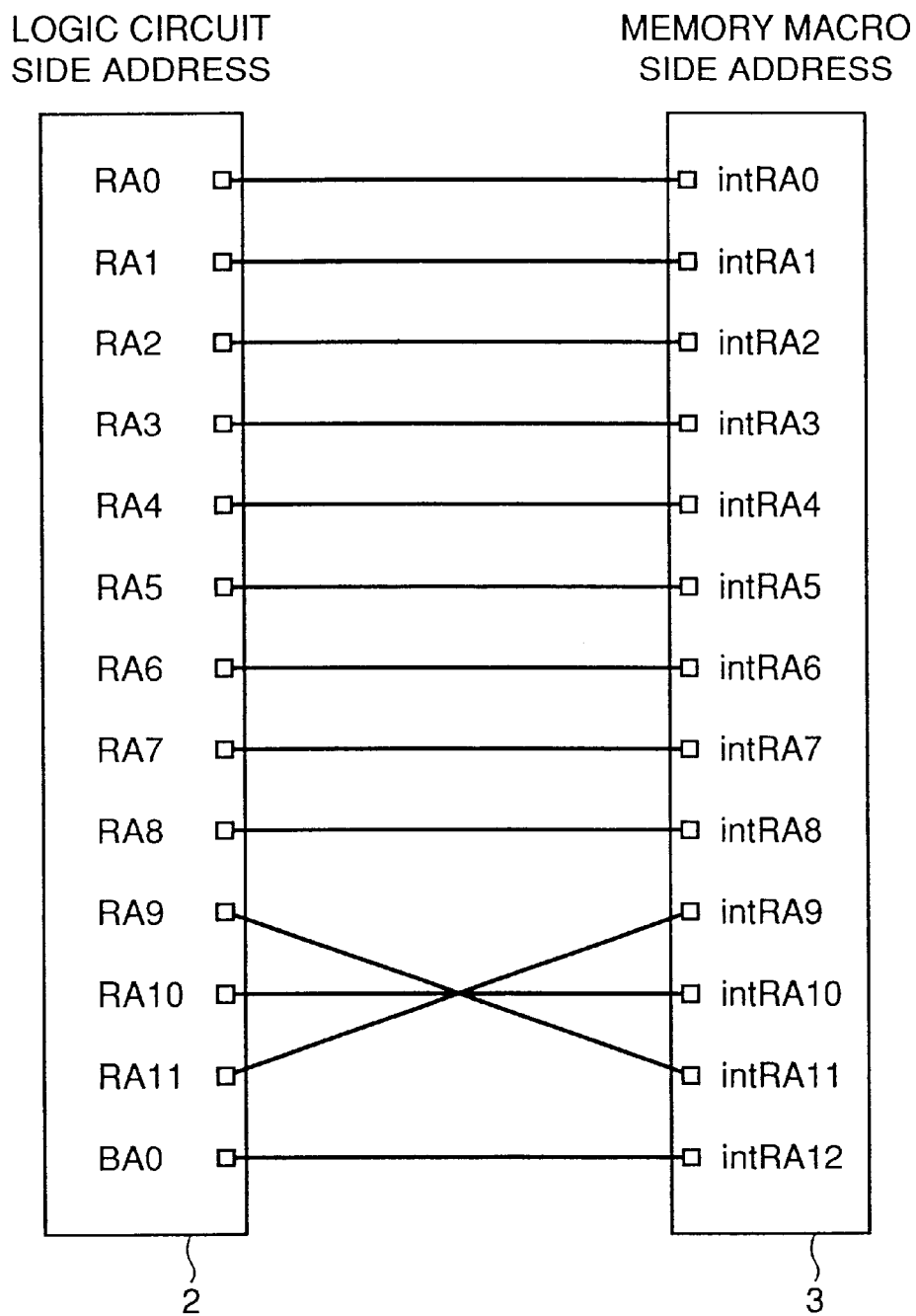
FIG. 6 is a diagram showing a connecting relation between the logic circuit 2 and the memory macro 3 in a 2-bank configuration.

To be detailed, as shown in FIG. 6, the address pins intRA9, intRA10, intRA11 and intRA12 are connected to the address pins RA11, RA10, RA9 and BA0, respectively.

Referring to FIG. 4, in a 4-bank configuration, the row address signals RA10 and RA9, and the bank address signals BA0 and BA1 are assigned as the row address signals intRA9, intRA10, intRA11 and intRA12, respectively.

Figure 7:
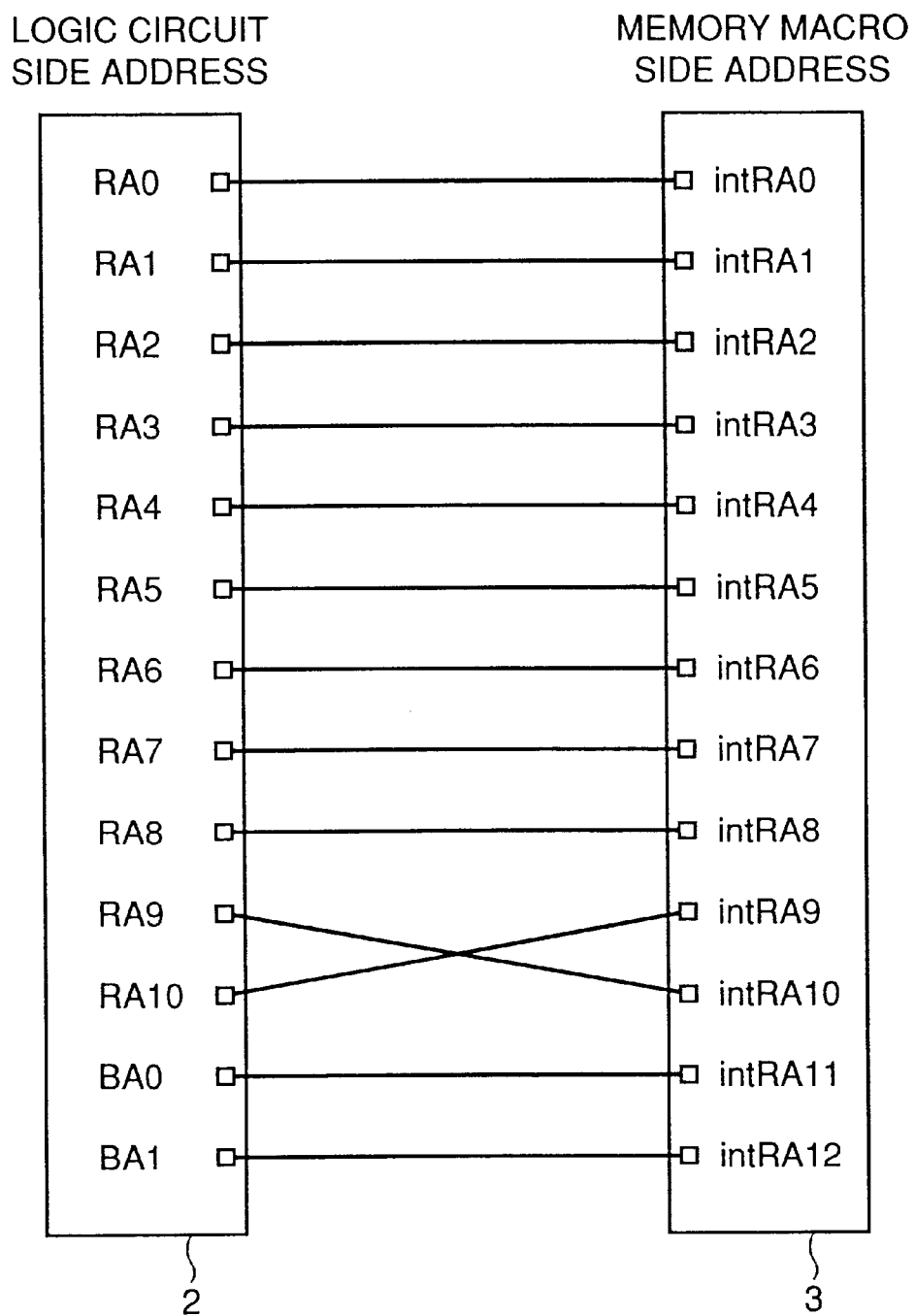
FIG. 7 is a diagram showing a connecting relation between the logic circuit 2 and the memory macro 3 in a 4-bank configuration.

To be detailed, as shown in FIG. 7, the address pins intRA9, intRA10, intRA11 and intRA12 are connected to the address pins RA10, RA9, BA0 and BA1, respectively.

In any of the bank configurations, the row address signals RA0 to RA8 output from the logic circuit 2 are supplied to the address pins intRA0 to intRA8 with no change therein.

In the first embodiment, a bank address signal is assigned to higher order bits of a block select address (intRA11, intRA12). Other bits in a block address are specified in the reverse order. That is, except a bank address signal, a bit string of a block select address output from the logic circuit 2 and a bit string of a block select address in the memory macro 3 are set in the reverse order.

Description will be made of a relation between a layout configuration of the memory macro 3 and address spaces in a case of a memory capacity is of 24 Mbits using FIGS. 8 to 10, wherein a portion shaded by hatching indicates a region with no layout configuration and an address inserted in a pair of parentheses "( )" indicates to lack an address space.

Referring to FIG. 8, in a 1-bank configuration, portions except for row addresses "1800" to "19FF," "1C00" to "1DFF," "1A00" to "1BFF" and "1E00" to "1FFF" in hexadecimal notation (the hexadecimal notation is hereinafter applied) among row addresses "0000" to "1FFF" serve as address spaces.

Address spaces for memory blocks m0, m1 and m2 correspond to row addresses "0000" to "01FF," "1000" to "11FF" and "0800" to "09FF," respectively. Address spaces for memory blocks m4, m5 and m6 correspond to row addresses "0400" to "05FF," "1400" to "15FF" and "0C00" to "0DFF," respectively.

Address spaces for memory blocks m8, m9 and m10 correspond to row addresses "0200" to "03FF," "1200" to "13FF" and "0A00" to "0BFF," respectively. Address spaces for memory blocks m12, m13 and m14 correspond to row addresses "0600" to "07FF," "1600" to "17FF" and "0E00" to "0FFF," respectively.

Figure 9:
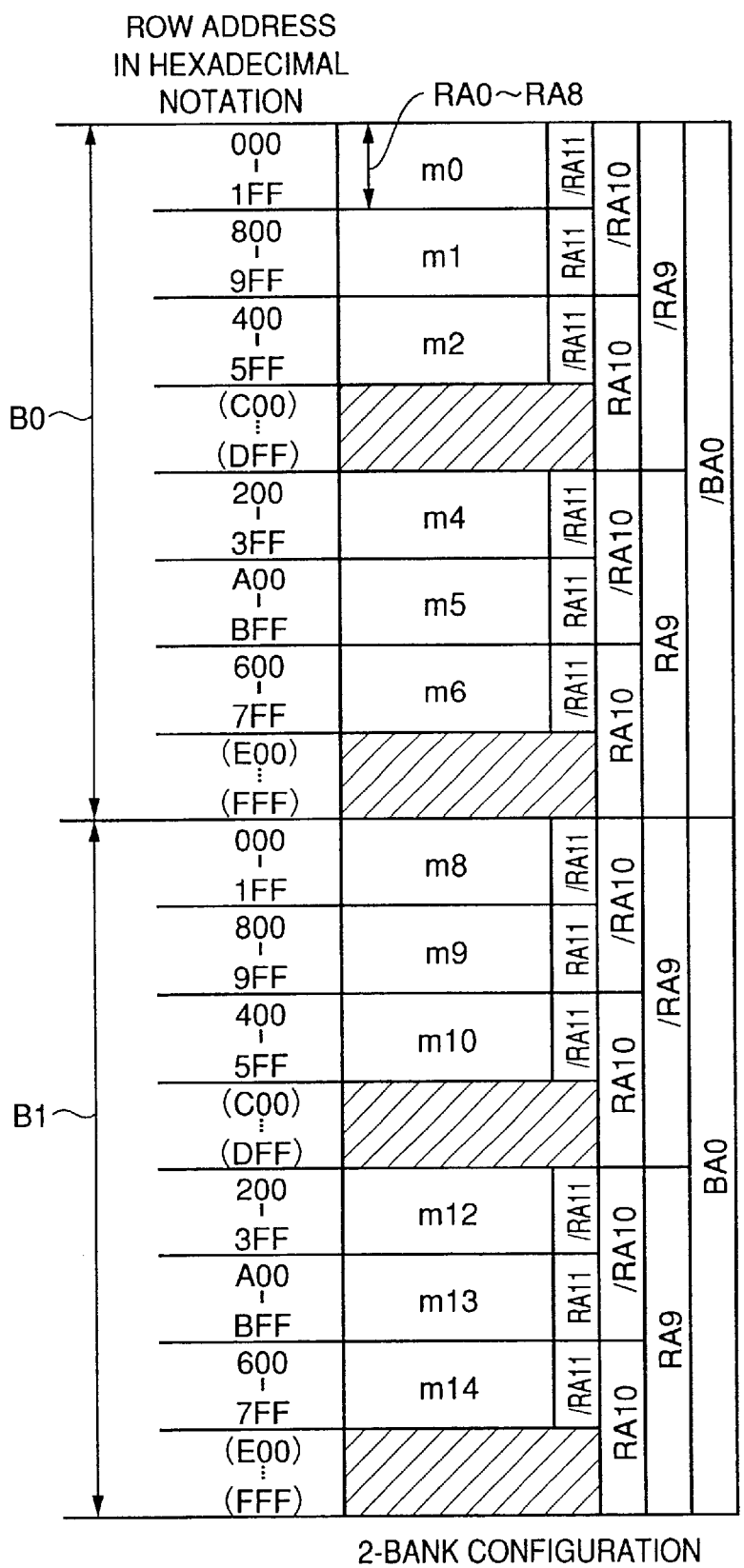
FIG. 9 is an illustration showing a layout configuration in a memory capacity of 24 Mbits and address spaces in the 2-bank configuration.

Referring to FIG. 9, in a 2-bank configuration, portions in each bank except for row addresses "C00" to "DFF" and "E00" to "FFF" among row addresses "000" to "FFF" serve as address spaces.

In the bank B0, the memory blocks m0, m1, m2, m4, m5 and m6 are memory spaces. Address spaces for the memory blocks m0, m1, m2, m4, m5 and m6 correspond to row addresses "000" to "1FF," "800" to "9FF," "400" to "5FF," "200" to "3FF," "A00" to "BFF" and "600" to "7FF."

In the bank B1, the memory blocks m8, m9, m10, m12, m13 and m14 are memory spaces. Address spaces for the memory blocks m8, m9, m10, m12, m13 and m14 correspond to row addresses "000" to "1FF," "800" to E"9FF," "400" to "5FF," "200" to "3FF," "A00" to "BFF" and "600" to "7FF."

Figure 10:
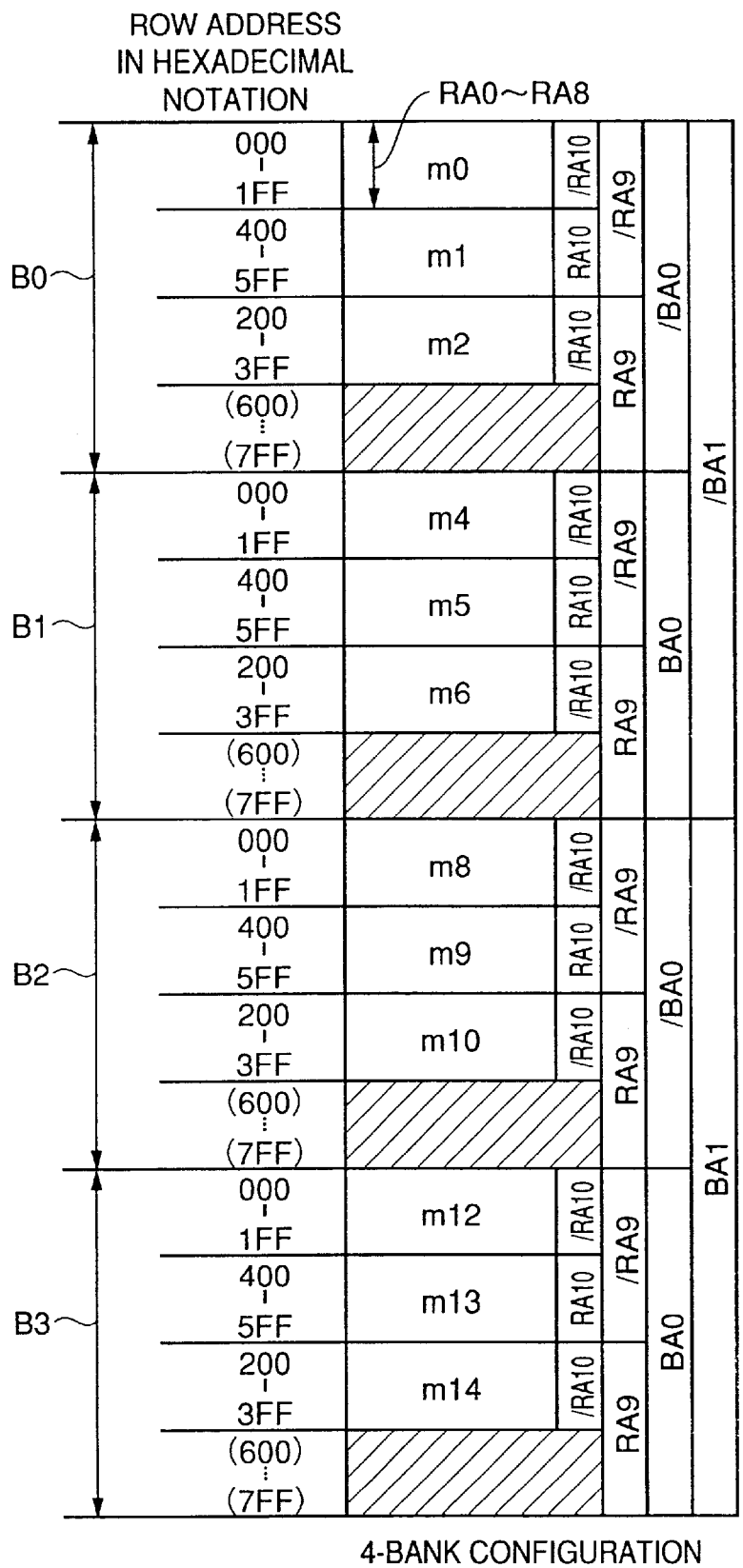
FIG. 10 is an illustration showing a layout configuration in a memory capacity of 24 Mbits and address spaces in the 4-bank configuration.

Referring to FIG. 10, in a 4-bank configuration, portions in each bank except for row addresses "600" to "7FF" among row addresses "000" to "7FF" serve as address spaces.

In the bank B0, the memory blocks m0, m1 and m2 are memory spaces. Address spaces for the memory blocks m0, m1 and m2 correspond to row addresses "000" to "1FF," "400" to "5FF" and "200" to "3FF," respectively.

In the bank B1, the memory blocks m4, m5 and m6 are memory spaces. Address spaces for the memory blocks m4, m5 and m6 correspond to row addresses "000" to "1FF," "400" to "5FF" and "200" to "3FF," respectively.

In the bank B2, the memory blocks m8, m9 and m10 are memory spaces. Address spaces for the memory blocks m8, m9 and m10 correspond to row addresses "000" to "1FF," "400" to "5FF" and "200" to "3FF," respectively.

In the bank B3, the memory blocks m12, m13 and m14 are memory spaces. Address spaces for the memory blocks m12, m13 and m14 correspond to row addresses "000" to "1FF," "400" to "5FF" and "200" to "3FF," respectively.

Accordingly, in any bank configuration, memory sizes of the respective banks are substantially equal to each other or one another. Further, it is found that consecutiveness of address spaces is maintained.

Figure 11:
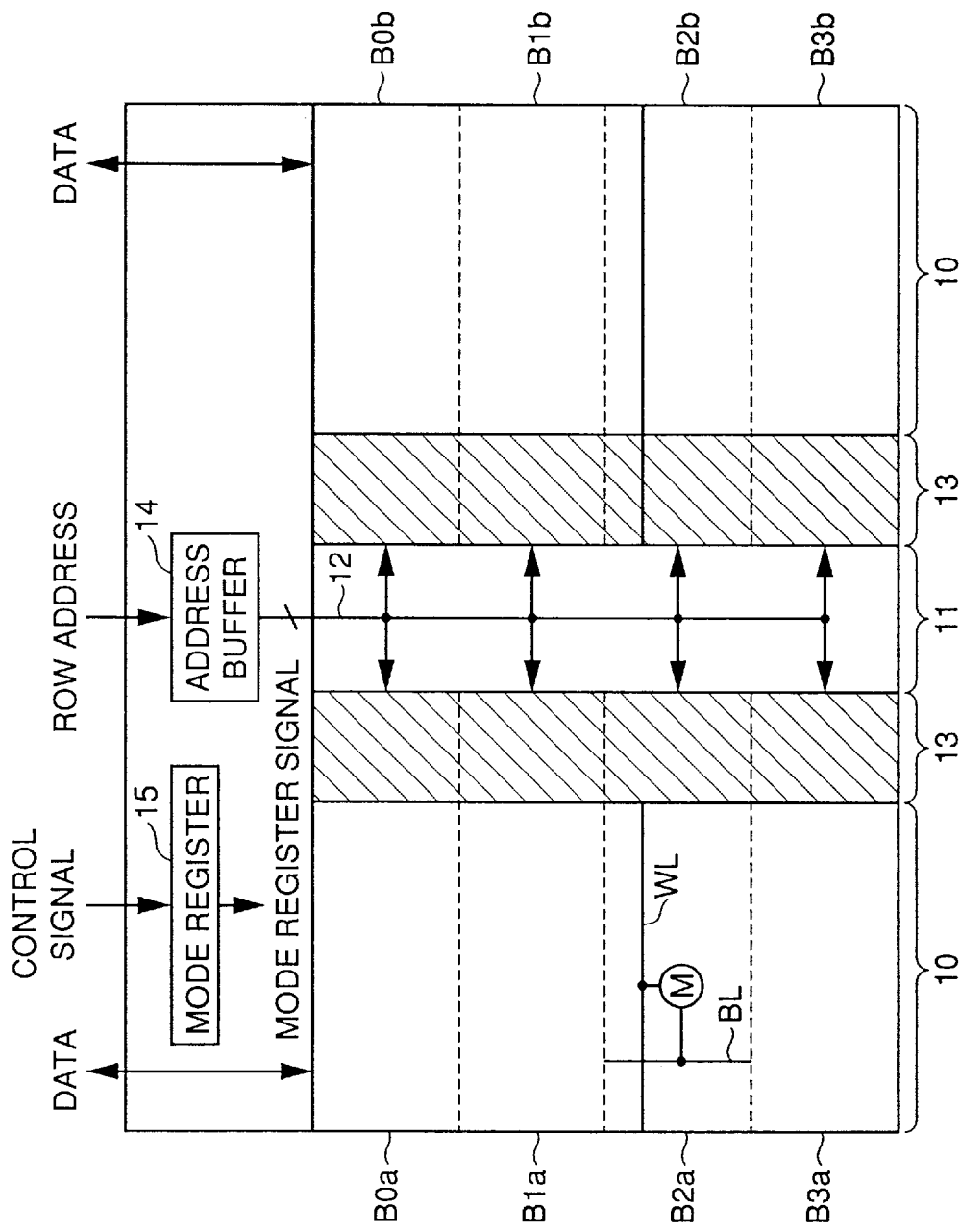
FIG. 11 is a block diagram showing an outline of a main part of the memory macro 3 according to the first embodiment.
Figure 12:
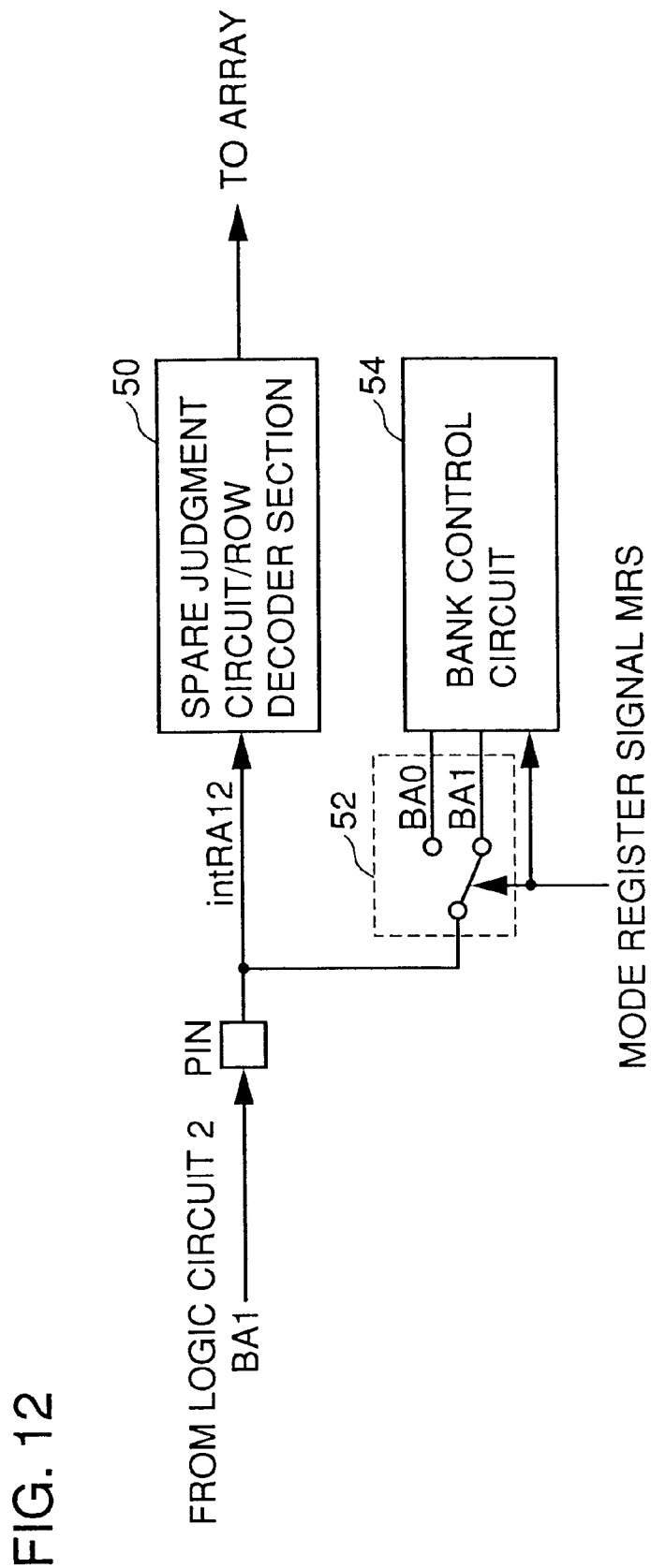
FIG. 12 is a block diagram for describing a relation between a bank address signal and a row address signal in the memory macro 3 according to the first embodiment.
Figure 13:
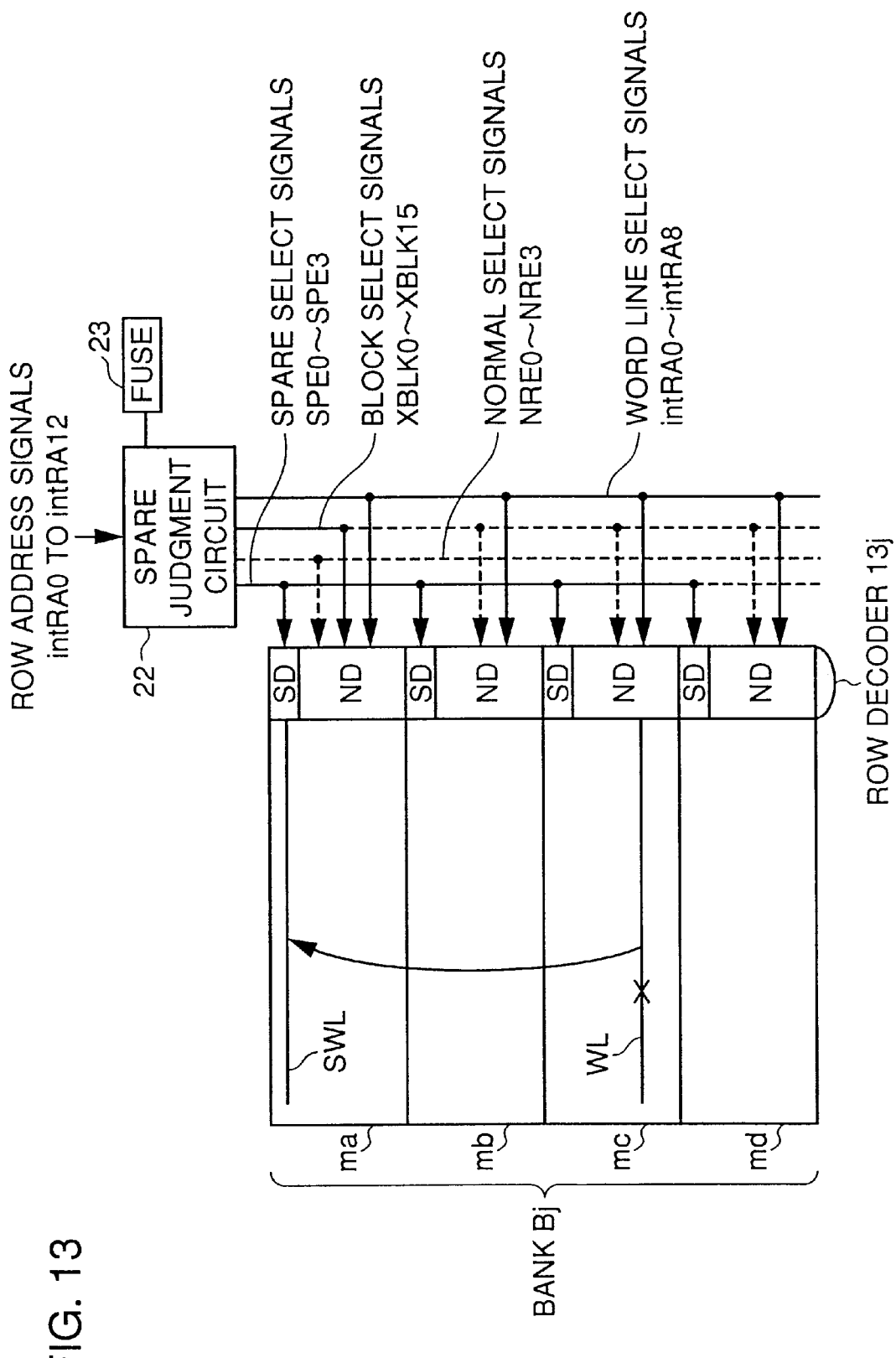
FIG. 13 is a block diagram for describing a redundancy configuration in the memory macro 3 according to the first embodiment.

An outline of a configuration of the macro 3 is here described using FIGS. 11 to 13. The memory macro includes: regions 10 constructing a memory cell array; a central control band 11; row decoders 13 performing a row select operation according to an address received from a signal line 12 disposed in the central control band 11; an address buffer 14 transmitting a row address onto the signal line 12; and a mode register 15.

The regions 10 and the row decoders 13 are determined on layout configurations thereof according to a memory capacity.

The memory macro shown in the figure is a case where a total memory capacity of 32 Mbits as a whole is realized in a 4-bank configuration with each bank of 8 Mbits in memory capacity. A bank B0 is constructed of blocks B0a and B0b disposed on both sides of the central control band 11. Likewise, banks B1, B2 and B3 are constructed of pairs of blocks, B1a and B1b; B2a and B2b; and B3a and B3b, respectively, disposed on both sides of the central control band 11.

The banks B0, B1, B2 and B3 are each configured such that four 2 Mbit memory blocks are stacked. Each bank includes a plurality of memory cells (M) disposed in a matrix arrangement; a plurality of word lines (WL) disposed in correspondence to a plurality of rows, a plurality of bit lines (BL) disposed in correspondence to a plurality of columns and spare word lines substituting for a defective word line, as described later. It should be appreciated that a memory capacity can be varied in memory blocks of 2 Mbits as a unit according to the order shown in FIG. 1.

The mode register 15 outputs a mode register signal according to a control signal supplied from the logic circuit 2.

A row address specifying a row direction, input externally, is latched in the address buffer 14 and sent onto a signal line 12 disposed in the central control band 11 at a proper timing. At this time, part of the row address is predecoded. The row address is sent to the row decoder 13 from the signal line 12 running in the central control band 11. Signals supplied from the signal line 12 are decoded by the row decoder 13.

A word line WL is activated by the row decoder 13. Furthermore, a memory cell M is selected according to a column address, input externally. When a read operation is specified from the logic circuit 2, a data on a selected memory cell is output to the logic circuit 2. When a write operation is specified from the logic circuit 2, a data received from the logic circuit 2 is written onto a selected memory cell.

Description will be given of a relation between a bank address signal output from the logic circuit 2 and a row address signal in the memory macro using FIG. 12. In FIG. 12, there is shown an example in which the bank address signal BA1 is assigned to a row address signal intRA12.

A signal received at the address pin intRA12 is supplied to a spare judgment circuit/row decoder section 50 as the row address signal intRA12. The spare judgment circuit/row decoder section 50 selects a normal word line or a spare word line according to row address signals.

A switch circuit 52 is disposed for an address pin intRA12. The switch circuit 52 performed a switching-over operation according to a mode register signal MRS output by a mode register 15.

When the bank address signal BA1 is assigned to the address pin intRA12, the address signal intRA12 is supplied to a bank control circuit 54 as the bank address signal BA1 by the switch circuit 52. The bank control circuit 54 controls a bank to be selected according to the bank address signals BA0 and BA1 being input.

Description will be given of a redundancy configuration applied to the memory macro 3 according to the first embodiment. In the first embodiment, a defective word line is replaced by a spare word line included in the same bank. The defective word line and the spare word line may be present in different memory blocks from each other or one another.

In FIG. 13, Bj indicates a bank; ma, mb, mc and md indicate respective memory blocks constructing the bank Bj;

a mark 13j indicates a row decoder provided for the bank Bj and a mark 22 indicates a spare judgment circuit.

A spare word line SWL substituting for a defective word line is provided in each memory block. In the row decoder 13j, for each memory block, there are provided a normal decoder ND for selecting a normal word line WL and a spare decoder SD for selecting a spare word line that saves a defective word line.

The spare judgment circuit 22 compares address information on a defective word line, programmed in the address program circuit constructed from fuses and so on corresponding to respective spare word lines, with the row address signals intRA0 to intRA12 being input (in FIG. 13, a circuit 23 constructed from fuses as one example).

As a result of comparison in the spare judgment circuit 22, when an input address is not a programmed address of a defective word line, the spare judgment circuit 22 decodes the row address signals intRA9 to intRA12 and sends block select signals XBLK0 to XBLK15 obtained as a decode result to the row decoder 13j. The row address signals intRA0 to intRA8 are sent to the row decoder 13j as a word line select signal. Furthermore, the spare judgment circuit 22 activates one of the normal select signals NRE0 to NRE3 indicating selection of a normal word line WL.

Here, the normal select signal NRE0 is activated when the block select signals XBLK0 to XBLK3 are selected; the normal select signal NRE1 is activated when the block select signals XBLK4 to XBLK7 are selected; the normal select signal NRE2 is activated when the block select signals XBLK8 to XBLK11 are selected; and the normal select signal NRE3 is activated when the block select signals XBLK12 to XBLK15 are selected.

The normal decoder ND selected by the signals NRE0 to NRE3, and XBLK0 to XBLK15 activates a word line in a memory block according to a word line select signal. The normal decoder ND and the spare decoder SD of a memory block that has not been selected by the signals NRE0 to NRE3, and XBLK0 to XBLK15 does not activate a word line.

On the other hand, when an input address is a programmed address of a defective word line as a result of comparison in the spare judgment circuit 22, a block select signal selecting a memory block is activated, to which a fuse with which the address coincides corresponds.

For example, when an address programmed on a fuse corresponding to a spare word line of a memory block m1 coincides with an input address, the block select signal XBLK1 is activated.

Furthermore, the spare judgment circuit 22 activates one of the spare select signals SPE0 to SPE3 indicating selection of a spare word line.

Here, the spare select signal SPE0 is activated when block select signals XBLK0 to XBLK3 are selected; the spare select signal SPE1 is activated when block select signals XBLK4 to XBLK7 are selected; the spare select signal SPE2 is activated when block select signals XBLK8 to XBLK11 are selected; and the spare select signal SPE3 is activated when block select signals XBLK12 to XBLK15 are selected.

As shown in the figure, when an address specifying a defective word line WL of the memory block mc is input, a spare word line SWL corresponding in the memory block ma is selected by the spare decoder SD of the memory block ma. The normal decoder ND of the memory block mc does not activate a word line since the normal select signal NRE is not activated. Therefore, a defective word line WL is not activated.

In such a manner, according to the first embodiment, the above described replacement saving is realized with no access a memory block allocated to a different bank.

Second Embodiment

Description will be made of a memory chip in the second embodiment. In the first embodiment, a bank address signal is assigned to the higher order bits of a block select address (intRA11, intRA12). On the other hand, in the second embodiment, a bank address signal is assigned to the lower order bits of a block select address. A memory macro according to the second embodiment is referred to memory macro 30. A Basic configuration of the memory macro 30 is the same as the memory macro 3.

Figure 15:
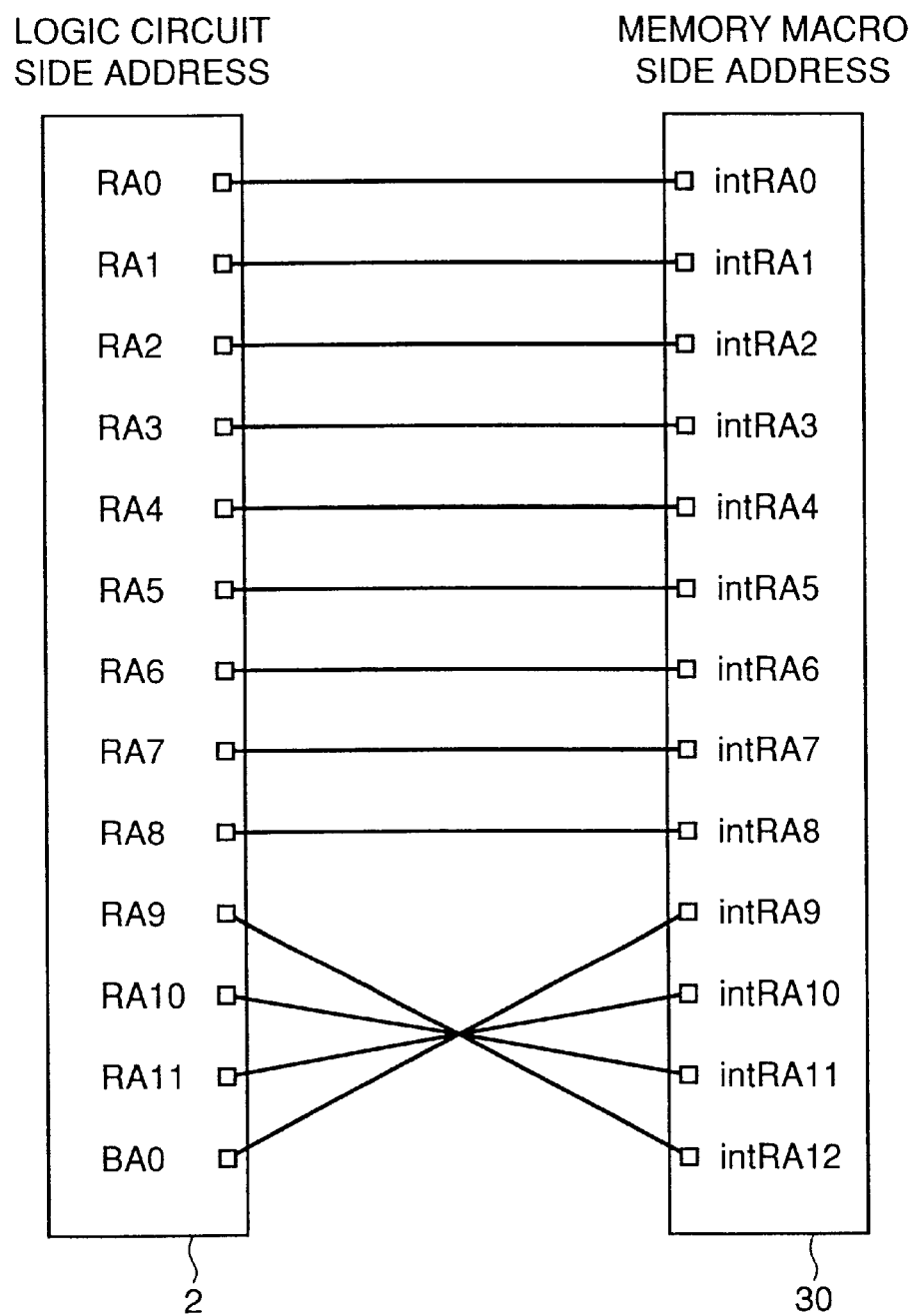
FIG. 15 is a diagram showing a connecting relation between the logic circuit 2 and a memory macro 30 in the 2-bank configuration.
Figure 16:
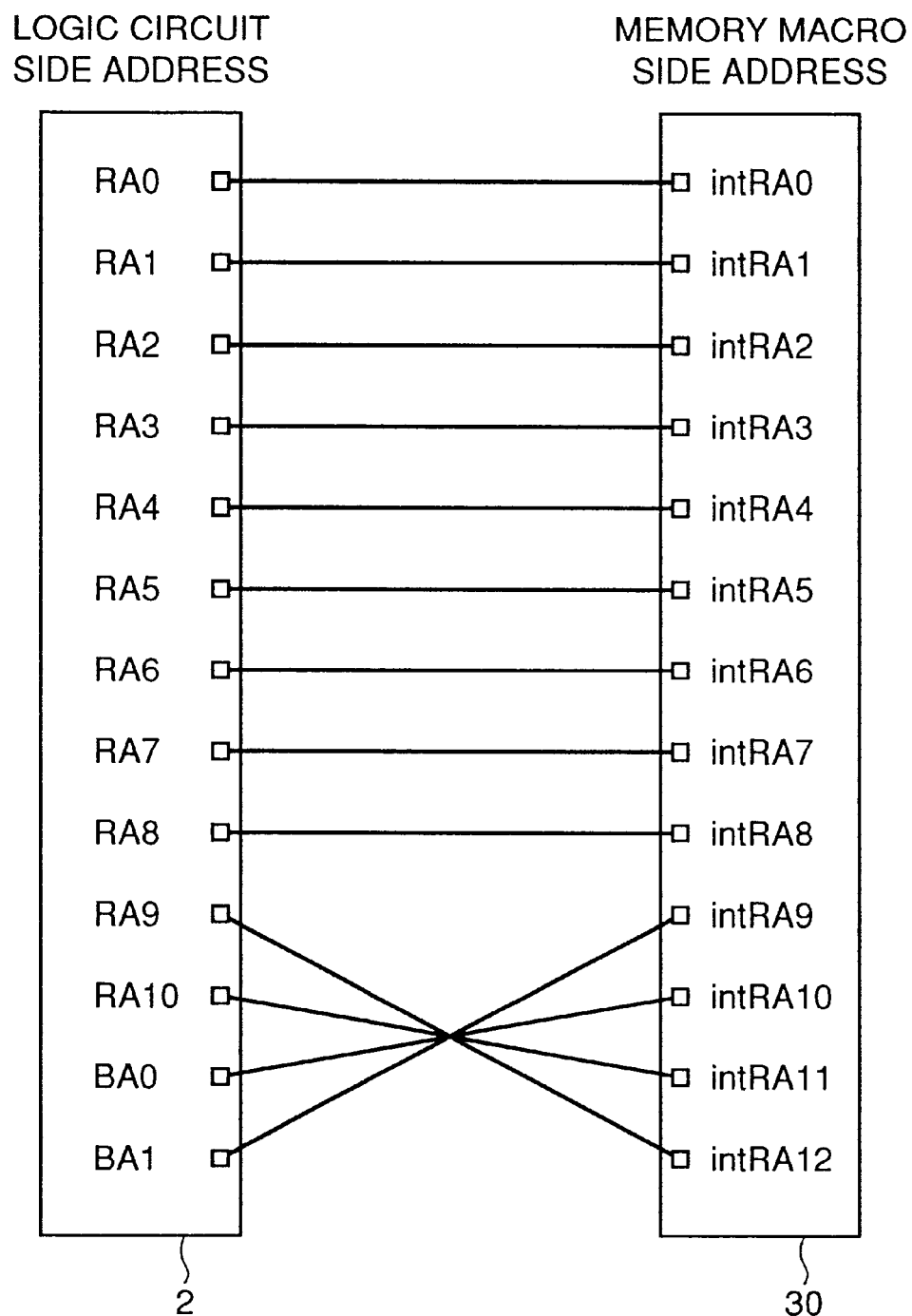
FIG. 16 is a diagram showing a connecting relation between the logic circuit 2 and the memory macro 30 in the 4-bank configuration.

A signal assigned to a row address signal intRAj in the second embodiment is shown in FIG. 14 and a connecting relation of address connection lines 4 is shown in FIGS. 15 and 16. Since a 1-bank configuration is the same as in the first embodiment, description thereof is omitted.

Referring to FIG. 14, in a 2-bank configuration, the bank address signal BA0, the row address signals RA11, RA10 and RA9 are assigned as the row address signals intRA9, intRA10, intRA11 and intRA12, respectively.

To be detailed, as shown in FIG. 15, the address pins intRA9, intRA10, intRA11 and intRA12 are connected to the address pins BA0, RA11, RA10 and RA9, respectively.

Referring to FIG. 14, in a 4-bank configuration, the bank address signals BA1 and BA0, the row address signals RA10 and RA9 are assigned as the row address signals intRA9, intRA10, intRA11 and intRA12, respectively.

To be detailed, as shown in FIG. 16, the address pins intRA9, intRA10, intRA11 and intRA12 are connected to the address pins BA1, BA0, RA10 and RA9, respectively.

In any of the bank configurations, the row address signals RA0 to RA8 output from the logic circuit 2 are supplied to the address pins intRA0 to intRA8, respectively, with no change therein.

Here, Description will be given of a relation between a layout configuration and address spaces of the memory macro 30 in a case of a memory capacity of 32 Mbits using FIGS. 17 and 18. FIG. 17 shows the 2-bank configuration and FIG. 18 shows the 4-bank configuration.

Referring to FIG. 17, a case of the 2-bank configuration is described. In the bank B0, the memory blocks m0, m2, m4, m6, m8, m10, m12 and m14 are memory spaces. Address spaces of the respective memory blocks m0, m2, m4, m6, m8, m10, m12 and m14 are assigned to row addresses "000" to "1FF," "200" to "3FF," "400" to "5FF," "600" to "7FF,""800"to "9FF," "A00" to "BFF," "C00" to "DFF" and "E00" to "FFF," respectively.

In the bank B1, the memory blocks m1, m3, m5, m7, m9, m11, m13 and m15 are memory spaces. Address spaces of the respective memory blocks m1, m3, m5, m7, m9, m11, m13 and m15 are assigned to row addresses "000" to "1FF," "200" to "3FF," "400" to "5FF," "600" to "7FF," "800" to "9FF," "A00" to "BFF," "C00" to "DFF" and "E00" to "FFF," respectively.

Figure 18:
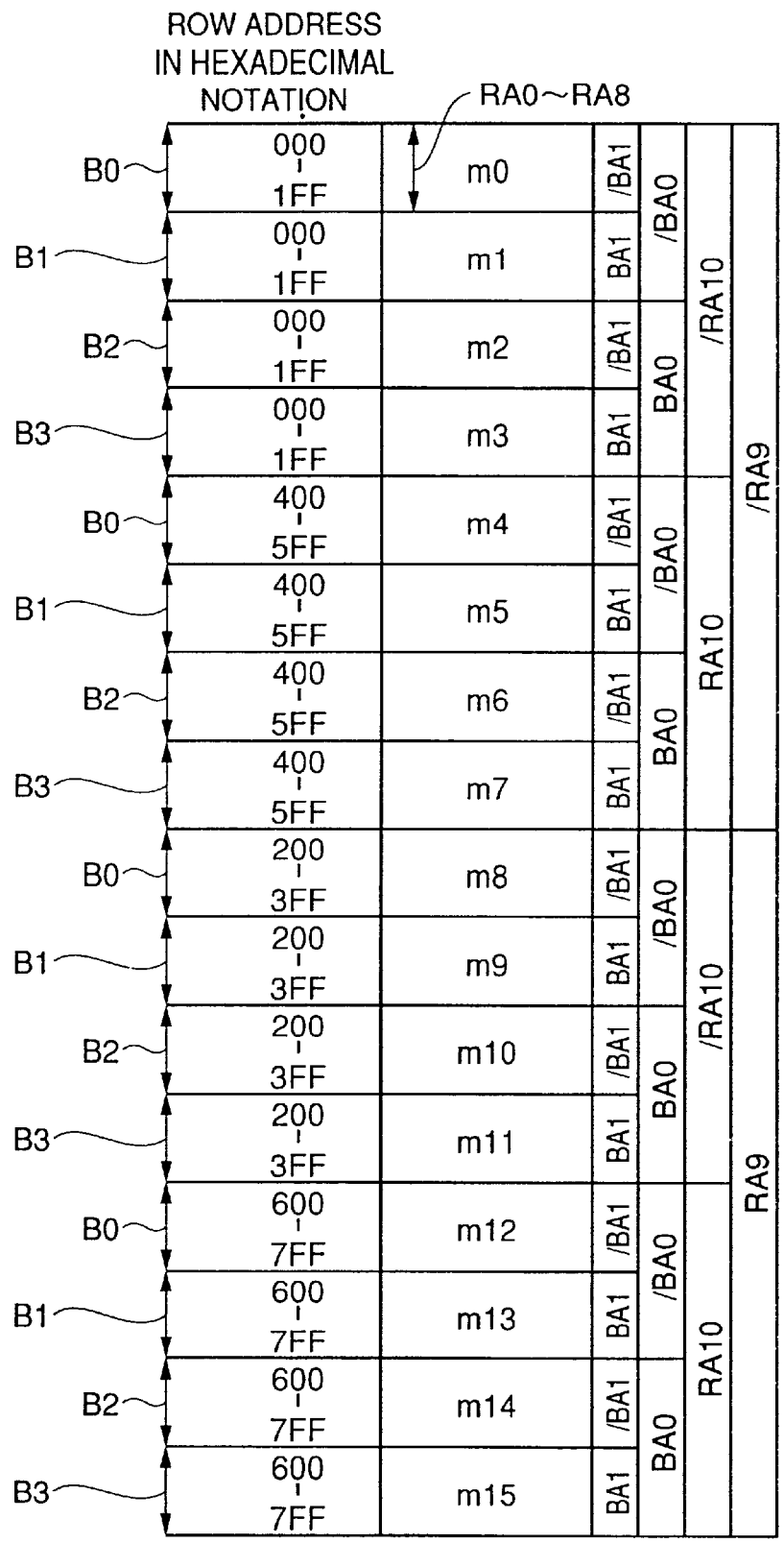
FIG. 18 is an illustration showing address spaces in the 4-bank configuration according to the second embodiment.

Referring to FIG. 18, a case of the 4-bank configuration is described. In the bank B0, the memory blocks m0, m4, m8 and m12 are memory spaces. Address spaces of the respective memory blocks m0, m4, m8 and m12 are assigned to row addresses "000" to "1FF," "400" to "5FF," "200" to "3FF" and "600" to "7FF," respectively.

In the bank B1, the memory blocks m1, m5, m9 and m13 are memory spaces. Address spaces of the respective memory blocks m1, m5, m9 and m13 are assigned to row addresses "000" to "1FF," "400" to "5FF," "200" to "3FF" and "600" to "7FF," respectively.

In the bank B2, the memory blocks m2, m6, m10 and m14 are memory spaces. Address spaces of the respective memory blocks m2, m6, m10 and m14 are assigned to row addresses "000" to "1FF," "400" to "5FF," "200" to "3FF" and "600" to "7FF," respectively.

In the bank B3, the memory blocks m3, m7, m11 and m15 are memory spaces. Address spaces of the respective memory blocks m3, m7, m11 and m15 are assigned to row addresses "000" to "1FF," "400" to "5FF," "200" to "3FF" and "600" to "7FF," respectively.

In a case of a memory capacity of 24 Mbits, no bank configuration is adopted and, for example, memory regions and row decoder regions corresponding to the memory blocks m12, m13, m14 and m15 are deleted from the layout configuration (the other portions are laid out).

To be detailed, the following memory blocks and respective parts of a row decoder for selecting the memory blocks are excluded from the layout: the memory block m12 and part of the row decoder for selecting the memory block m12 (part of the row decoder selected by a signal /intRA9), the memory block m13 and part of the row decoder for selecting the memory block m13 (part of the row decoder selected by a signal intRA9), the memory block m14 and part of a row decoder for selecting the memory block m14 (part of the row decoder selected by a signal intRA9) and the memory block m15 and part of the row decoder for selecting the memory block m15 (part of the row decoder selected by a signal intRA9).

Array block control circuits other than a row decoder provided essentially for controlling a memory block are excluded from the layout: for example, a sense amplifier drive signal driver driving a sense amplifier drive signal for driving a sense amplifier amplifying a potential difference between bit lines constituting a pair, a column select line driver for selecting a column direction and the like.

With such configurations, consecutiveness of address spaces in each bank can be ensured. Furthermore, memory sizes of the respective banks are substantially equal to each other or one another.

Figure 19:
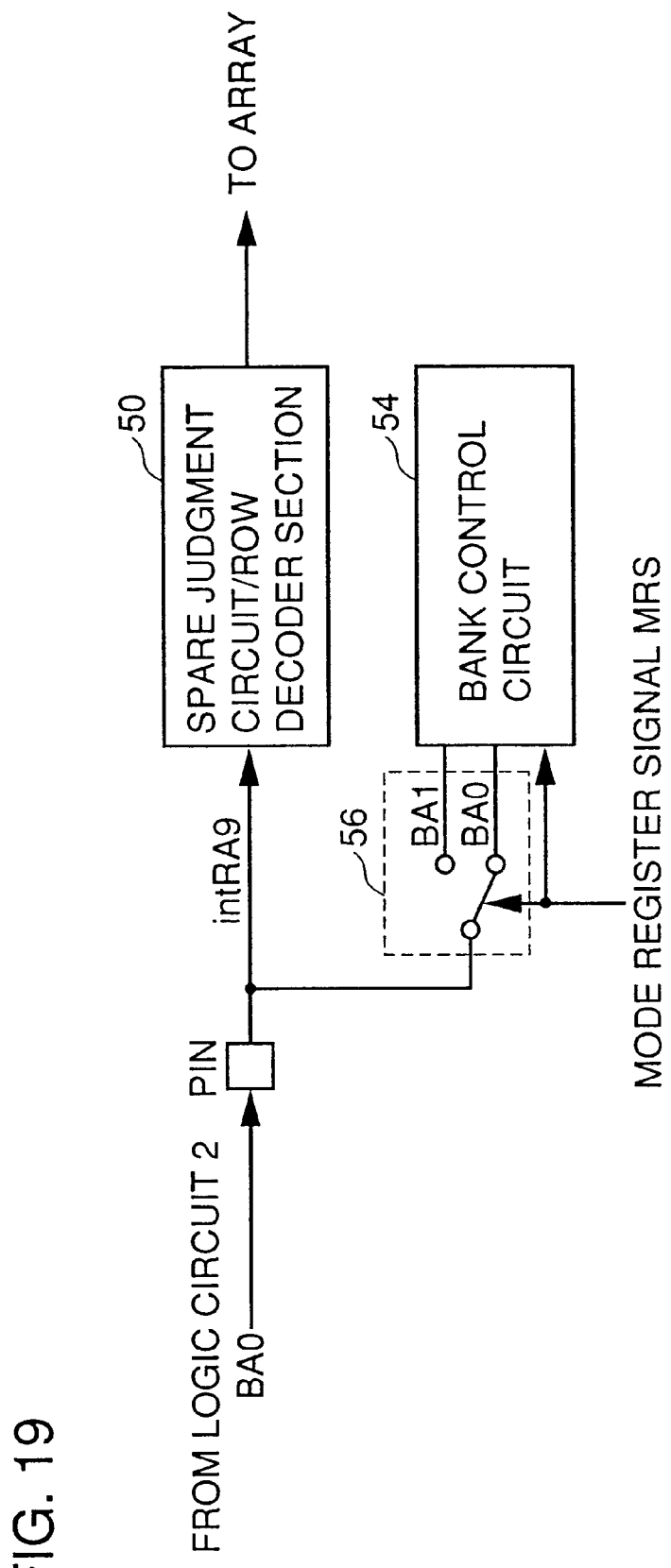
FIG. 19 is a block diagram for describing a relation between a bank address signal and a row address signal in the memory macro 30 according to the second embodiment.

Here, description will be given of a relation between a bank address signal and a row address in the memory macro 30 using FIG. 19. In FIG. 19, there is shown a case where the bank address BA0 is assigned to the row address signal intRA9.

A signal received at the address pin intRA9 is supplied to the spare judgment circuit/row decoder section 50 as the row address signal intRA9. The spare judgment circuit/row decoder section 50 select a normal word line or a spare word line according to a row address signal.

A switch circuit 56 is provided for the address pin intRA9. The switch circuit 56 performs switching-over according to a mode register signal MRS output from a mode register 15.

When the bank address signal BA0 is assigned to the address pin intRA9, the row address signal intRA9 is supplied to the bank control circuit 54 as the bank address signal BA0 by the switch circuit 56.

Then, description will be made of redundancy configuration applied to the memory macro 30 according to the second embodiment using FIG. 20. In the second embodiment, a defective word line is replaced with a spare word line within the same memory block.

Figure 20:
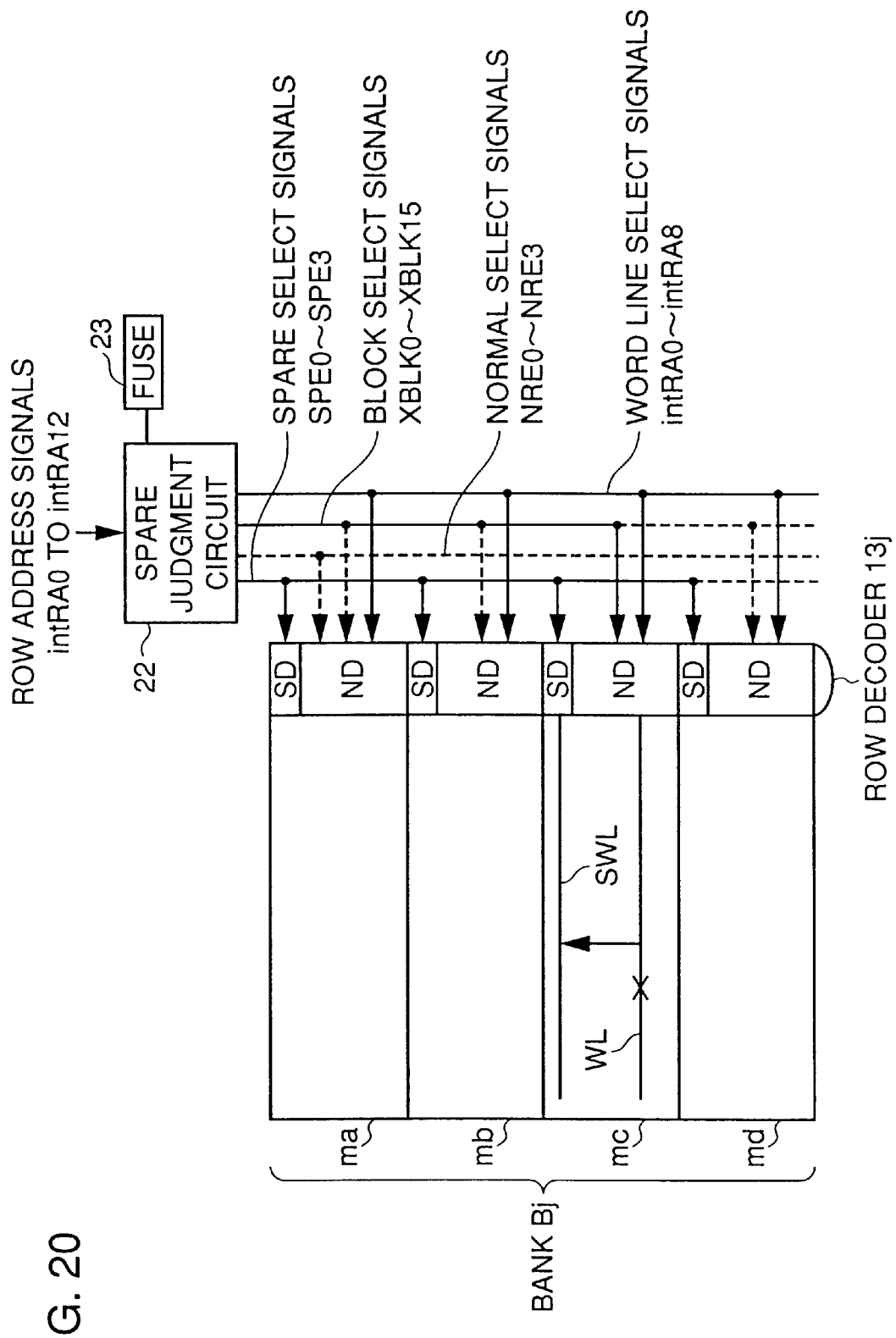
FIG. 20 is a block diagram for describing a redundancy configuration in the memory macro 30 according to the second embodiment.
Figure 21:
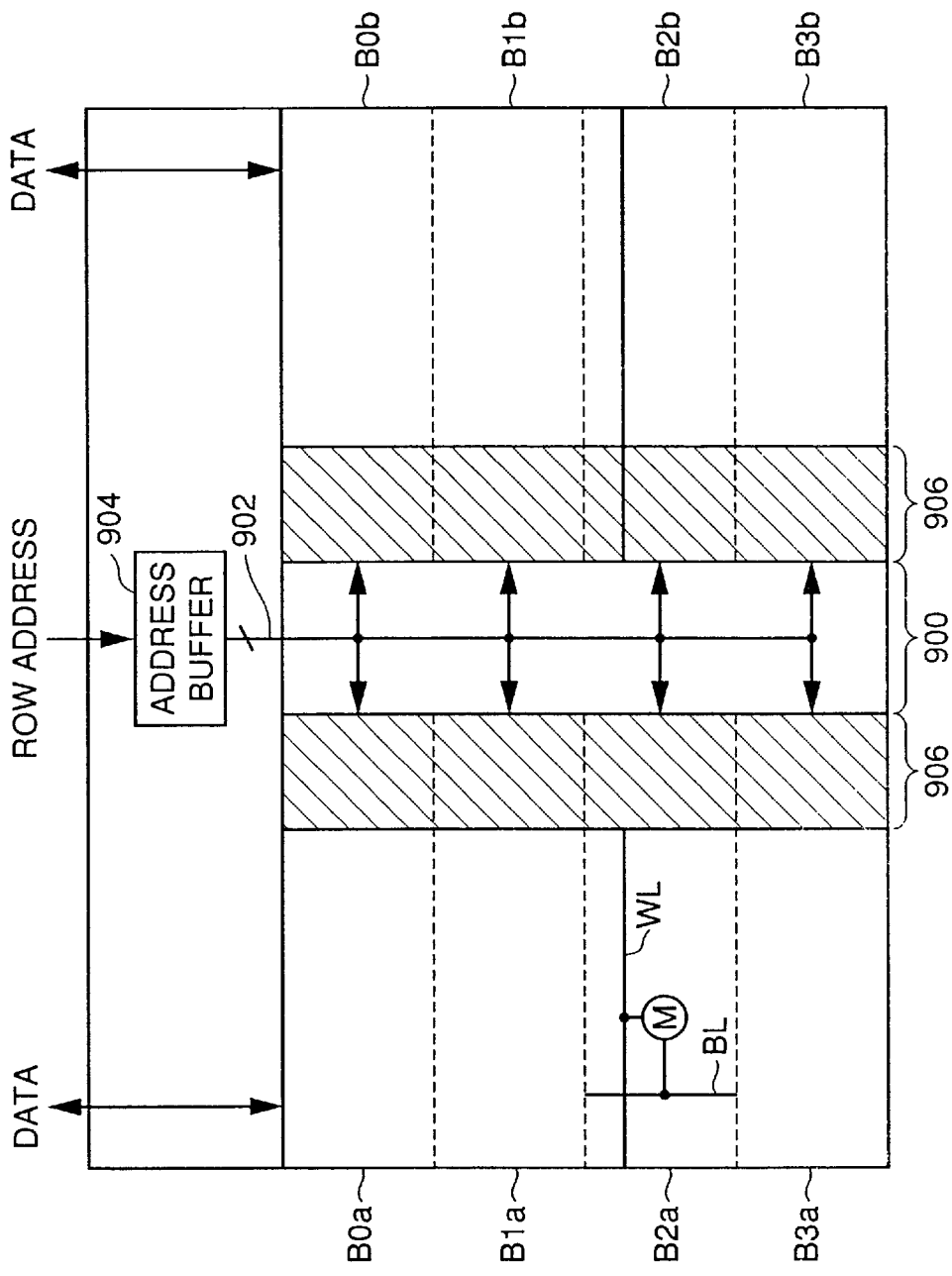
FIG. 21 is a block diagram describing a conventional memory macro.
Figure 22:
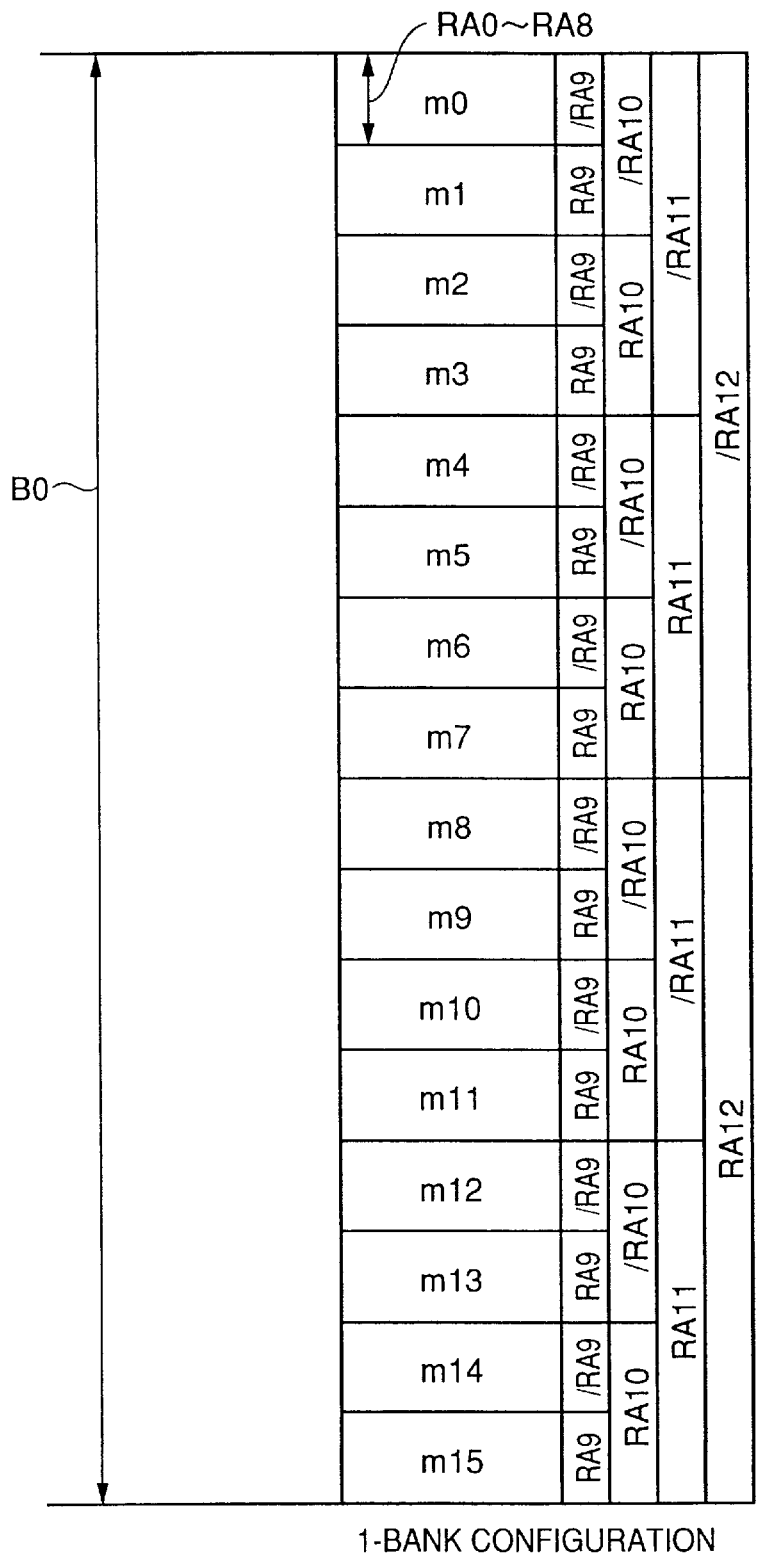
FIG. 22 is an illustration showing memory spaces in the 1-bank configuration of a conventional memory macro.
Figure 23:
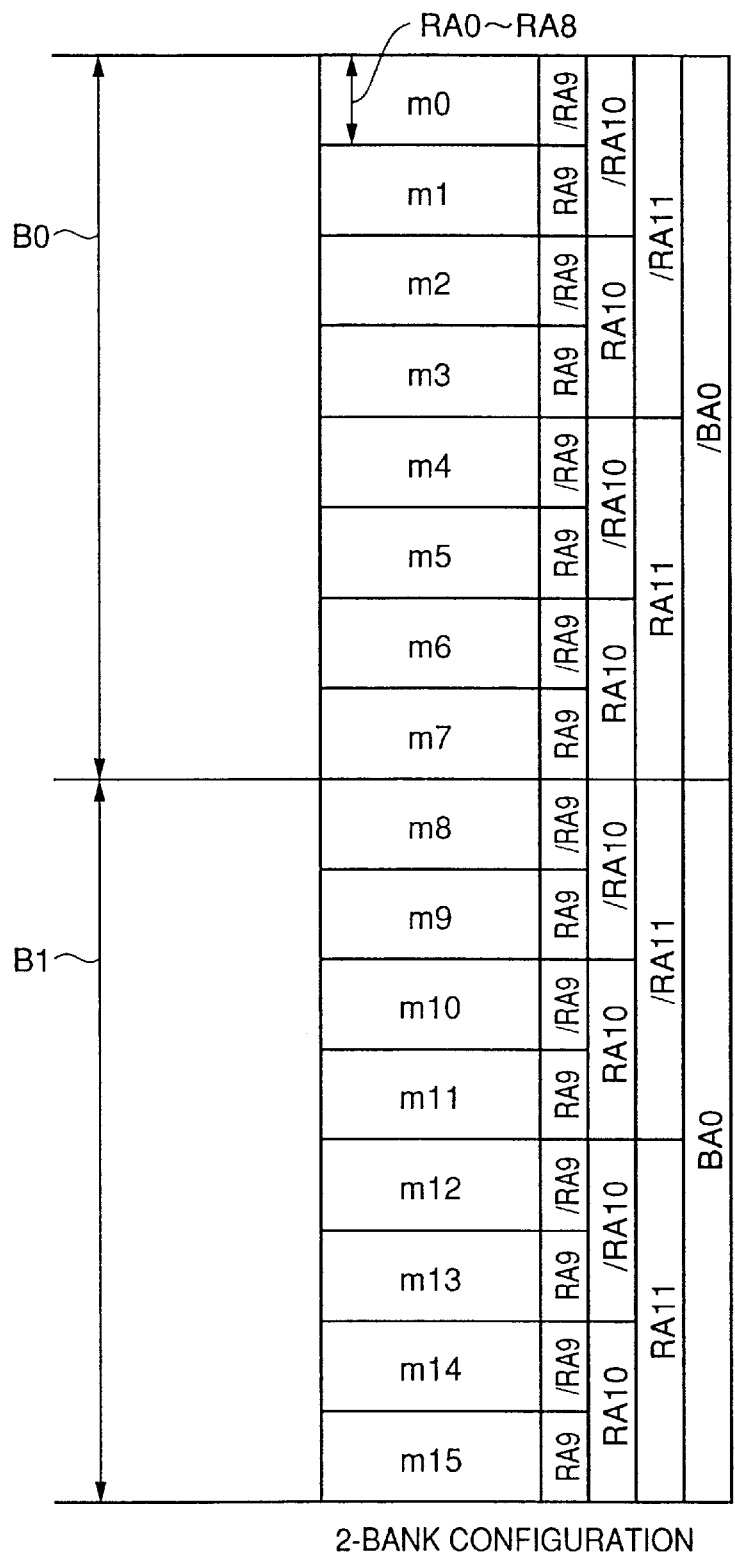
FIG. 23 is an illustration showing memory spaces in the 2-bank configuration of a conventional memory macro.
Figure 24:
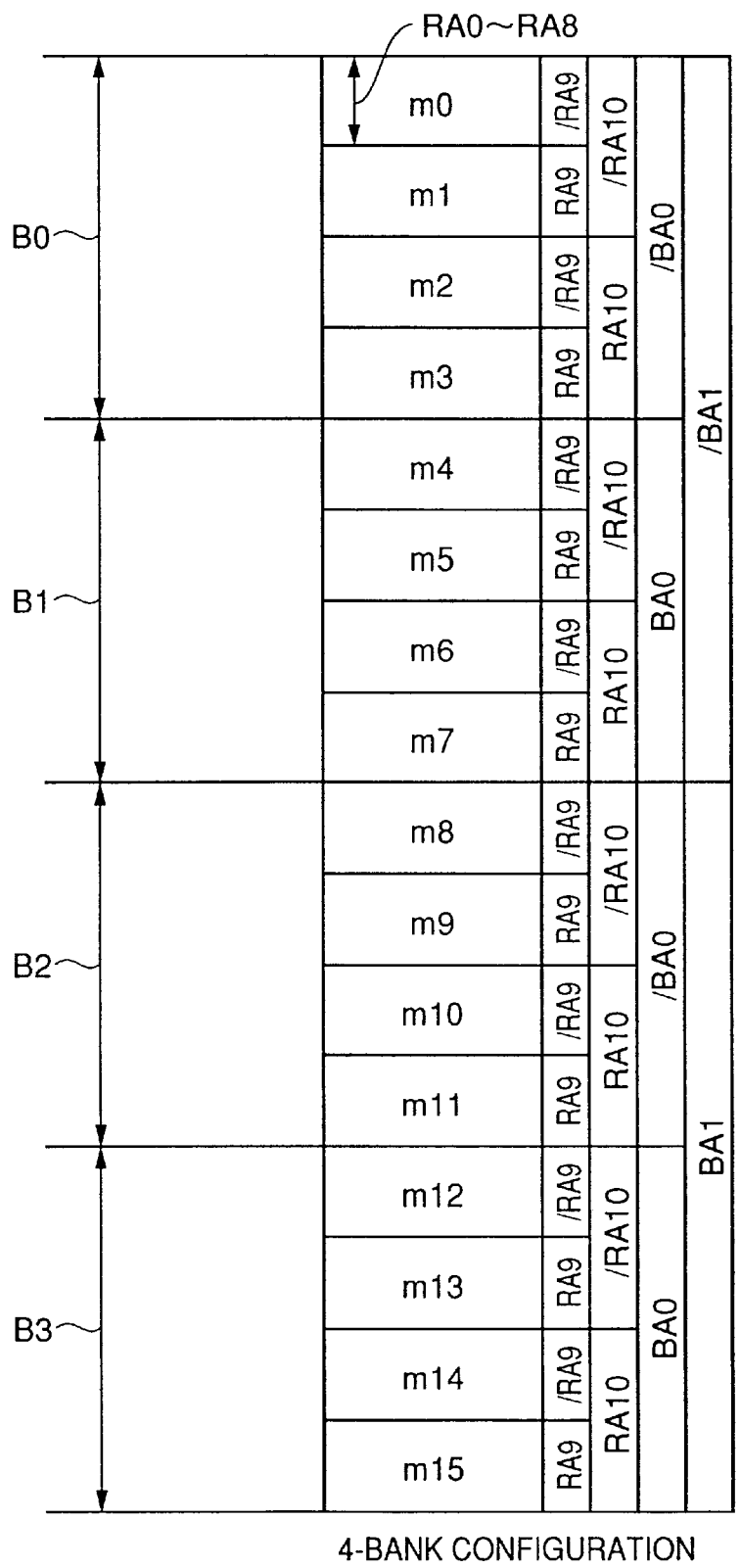
FIG. 24 is an illustration showing memory spaces in the 4-bank configuration of a conventional memory macro.
Figure 25:
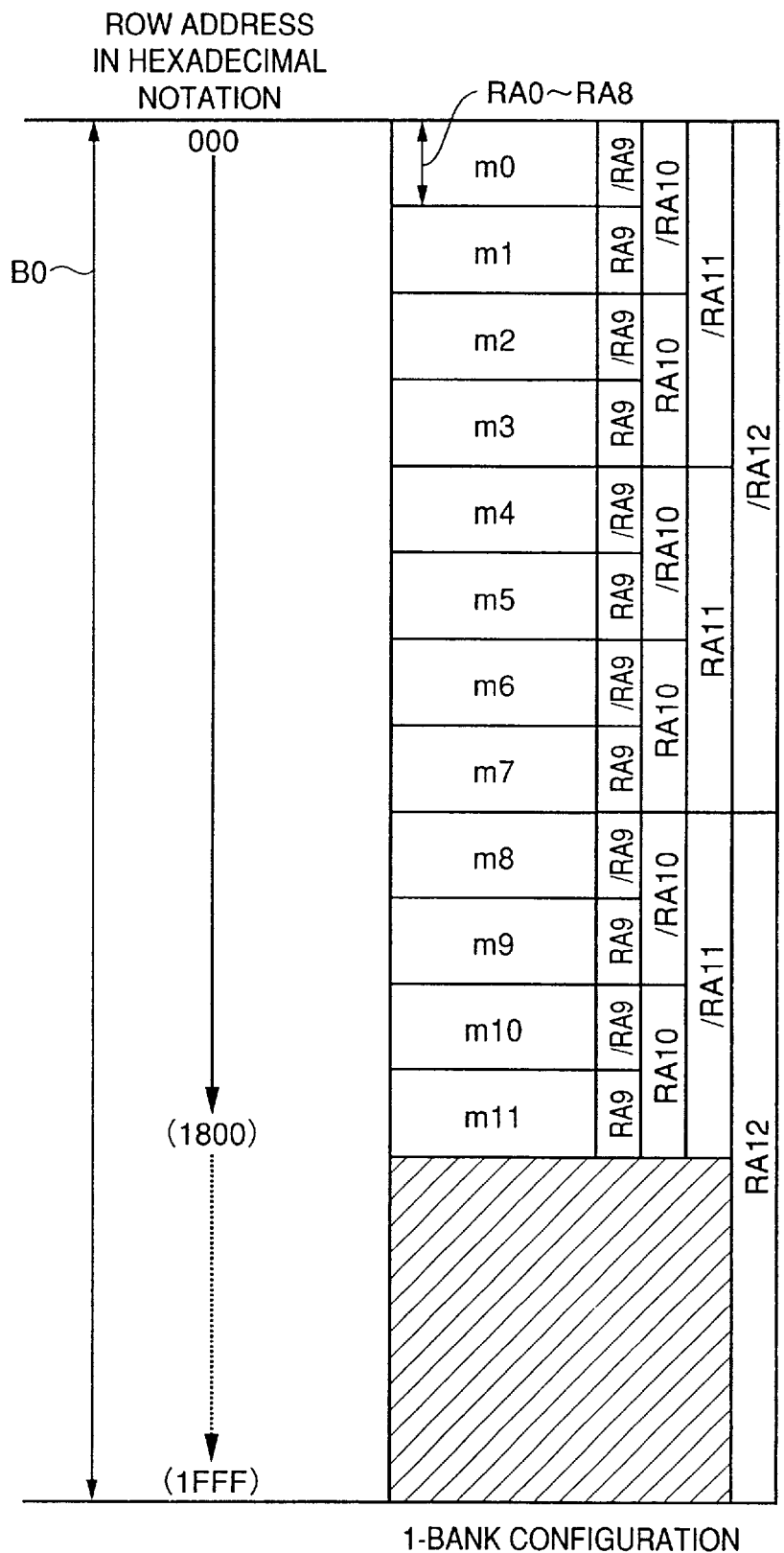
FIG. 25 is an illustration for describing a layout configuration in the 1-bit configuration of a conventional memory macro of 24 Mbits.
Figure 26:
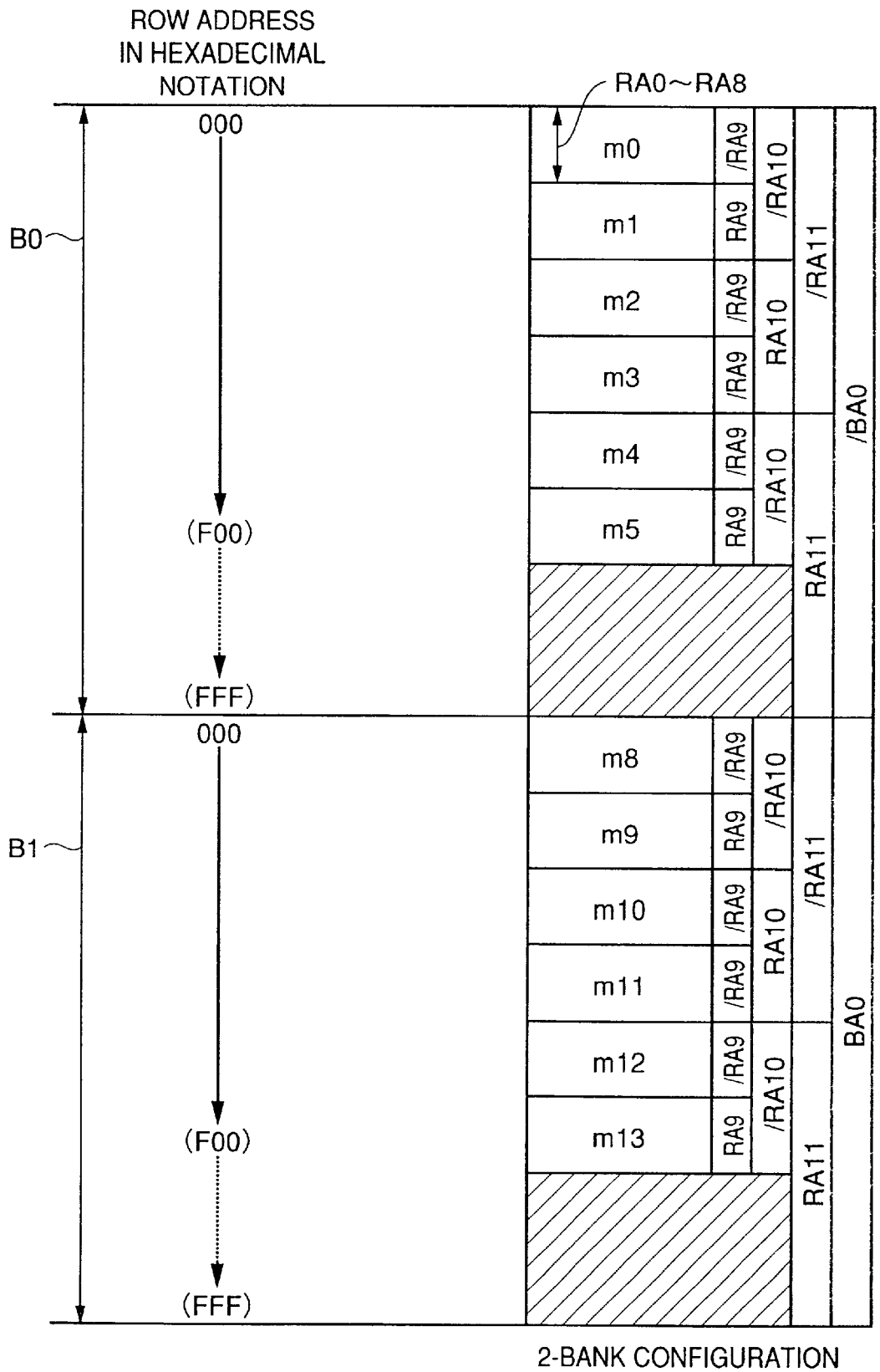
FIG. 26 is an illustration for describing a layout configuration in the 2-bit configuration of a conventional memory macro of 24 Mbits.
Figure 27:
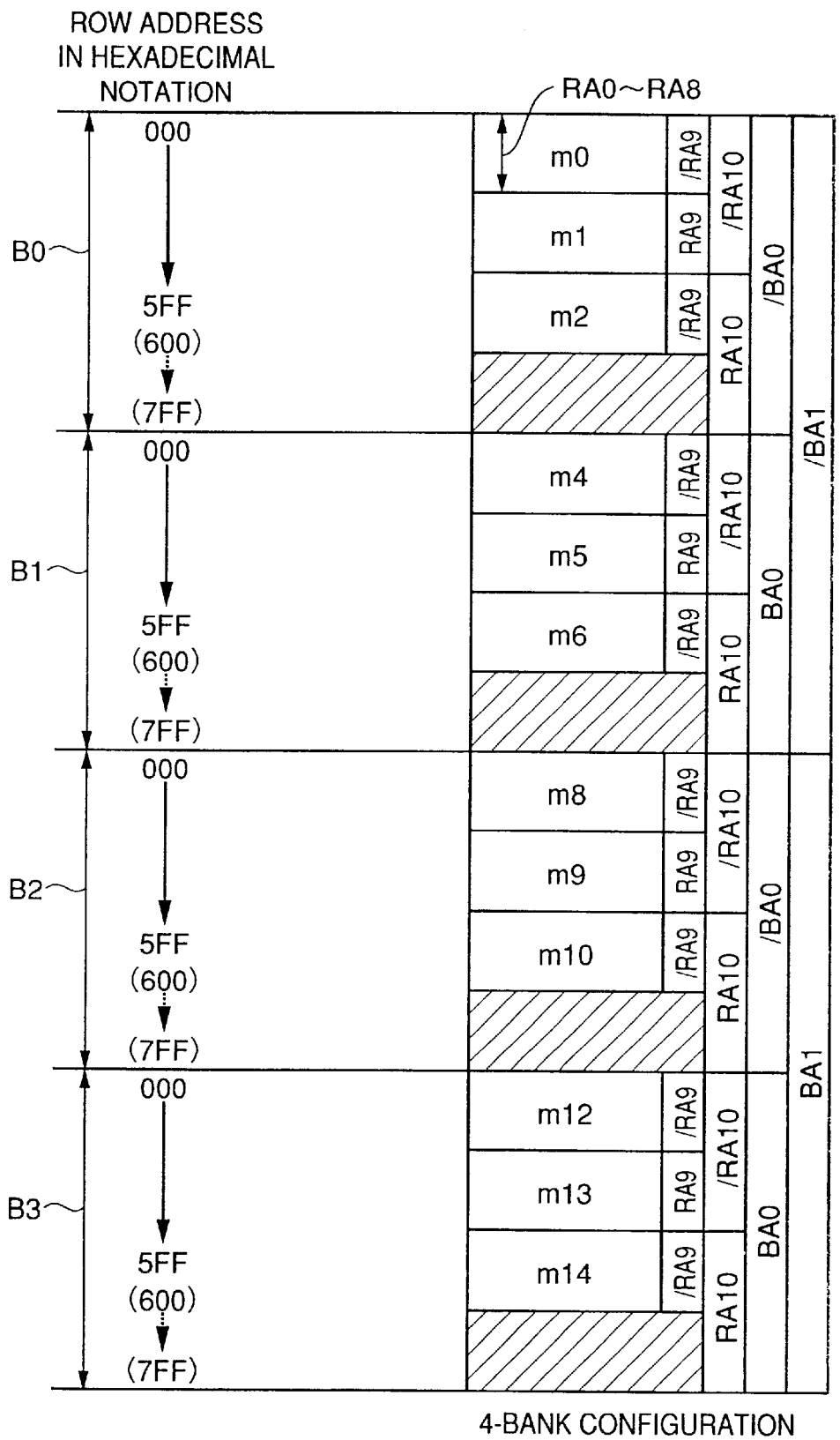
FIG. 27 is an illustration for describing a layout configuration in the 4-bit configuration of a conventional memory macro of 24 Mbits.
Figure 28:
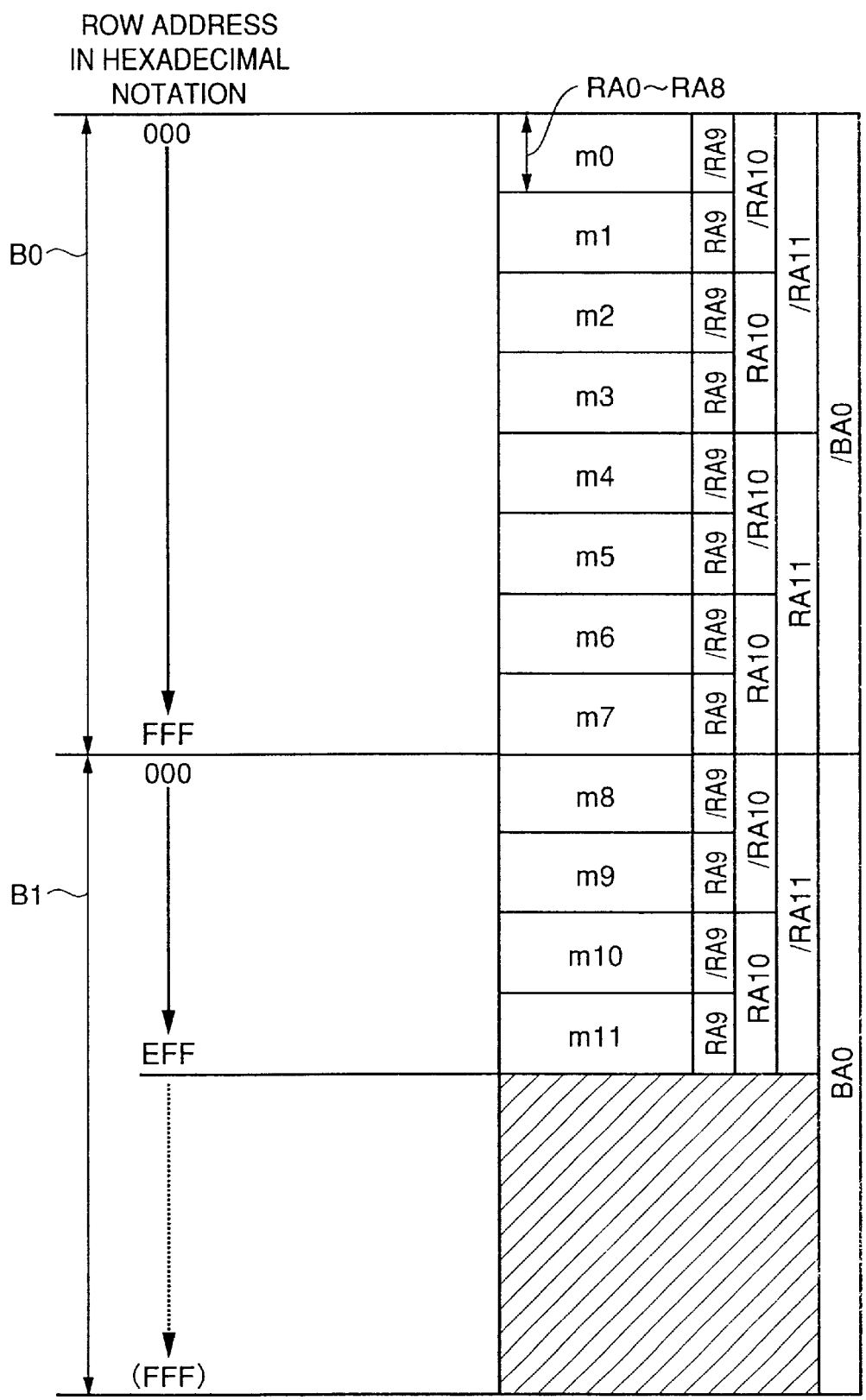
FIG. 28 is an illustration for describing a problem of a conventional memory macro.
Figure 29:
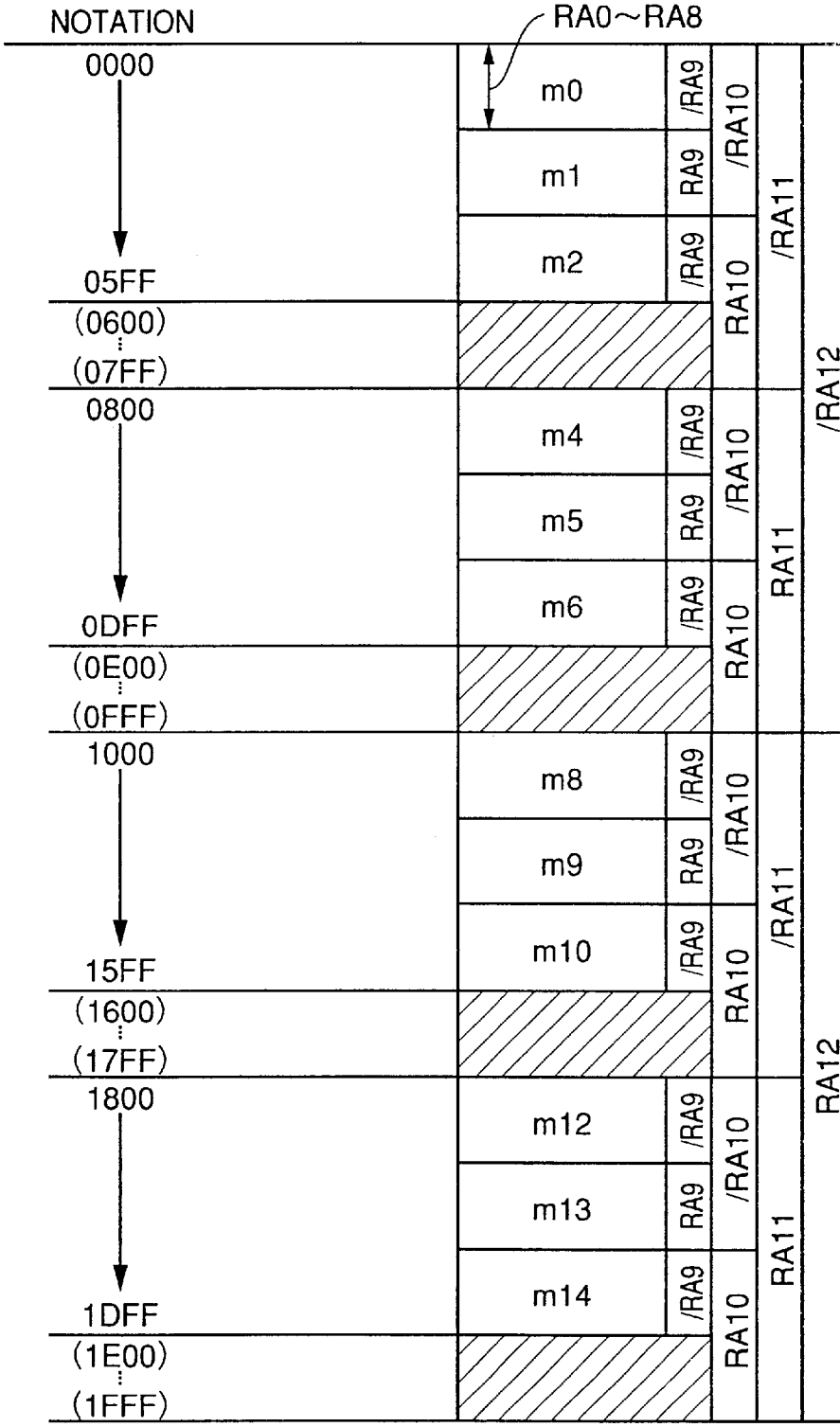
FIG. 29 is an illustration for describing a problem of a conventional memory macro.

In FIG. 20, Bj indicates a bank, ma, mb, mc and md indicate memory blocks constructing the bank Bj, a mark 13j indicates a row decoder provided for the bank Bj and a mark 22 indicates a spare judgment circuit provided for the bank Bj.

A spare word line SWL substituting for a defective word line is disposed in each memory block. In the row decoder 13j, there are included a normal decoder for selecting a normal word line WL and a spare decode SD for selecting a spare word line for saving a defective word line, for each memory block.

The spare judgment circuit 22 compares address information on a defective word line programmed in an address programming circuit constructed of fuses and so on, corresponding respective spare word lines, with the input address signals intRA0 to intRA12 (in the figure, there is shown a circuit 23 constructed of fuses, for example).

When as a result of comparison in the spare judgment circuit 22, an input address is not a defective address, the spare judgment circuit 22 decodes the address signals intRA9 to intRA12 and sends block select signals XBLK0 to XBLK15 obtained as a decode result to the row decoder 13j. The row address signals intRA0 to intRA8 are sent to the row decoder 13j as word line select signals. Furthermore, the spare judgment circuit 22 activates one of normal select signals NRE0 to NRE3 indicating a selection of a normal word line WL.

Here, the normal select signal NRE0 is activated when the block select signals XBLK0 to XBLK3 are selected; the normal select signal NRE1 is activated when the block select signals XBLK4 to XBLK7 are selected; the normal select signal NRE2 is activated when the block select signals XBLK8 to XBLK11 are selected; and the normal select signal NRE3 is activated when the block select signals XBLK12 to XBLK15 are selected.

A normal decoder ND selected by the signals NRE0 to NRE3 and XBLK0 to XBLK15 activates a word line in a memory block according to a word line select signal. A normal decoder ND and spare decoder SD of a memory block that has not been selected by the signals NRE0 to NRE3 and XBLK0 to XBLK15 activate no word line.

On the other hand, when as a result of comparison in the spare judgment circuit 22, an input address is a defective address, the spare judgment circuit 22 activates one of signals SPE0 to SPE3 indicating selection of a spare word line.

The spare select signal SPE0 is activated when the block select signals XBLK0 to XBLK3 are selected; the spare select signal SPE1 is activated when the block select signals XBLK4 to XBLK7 are selected; the spare select signal SPE3 is activated when the block select signals XBLK8 to XBLK11 are selected; and the spare select signal SPE4 is activated when the block select signals XBLK12 to XBLK15 are selected.

The spare judgment circuit 22 decodes the row address signals intRA9 to intRA12 and outputs the block select signals XBLK8 to XBLK11, similar to a case where no spare word line is selected.

When as shown in the figure, an address specifying a defective word line WL of the memory block mc is input, a spare word line corresponding in the memory block mc is selected by a spare decoder SD of the memory block mc. The normal decoder ND of the memory block mc activates no word line since the normal select signal NRE is not activated. Therefore, no defective word line WL is activated.

In this way, according to the second embodiment, the above described replacement saving can be realized with no access to a memory block allocated into a different bank.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory macro including: a memory cell array region including a plurality of memory cells disposed in a matrix arrangement, a plurality of word lines disposed in correspondence to a plurality of rows, and a plurality of bit lines disposed in correspondence to a plurality of columns; and a select circuit for selecting a memory cell, a layout of said memory macro being determined according to a memory capacity;

a logic circuit specifying operation of said memory macro; and

A an address connection line for transmitting an address to select a memory cell to said memory macro from said logic circuit, disposed between said logic circuit and said memory macro, wherein said address connection line is interconnected according to a bank configuration of said memory cell array region such that consecutiveness of an address space in a bank is maintained, and wherein said plurality of memory cells are grouped into a plurality of memory blocks, said address comprises:

a word line select address, and a block select address having a plurality of bits;

said select circuit selects not only a memory block according to said block select address but also a specific word line included in said selected memory block according to said word line select address, and said address connection line is interconnected such that higher order bits of said block select address output from said logic circuit are assigned to lower order bits of said block select address in said memory macro, while lower order bits of said block select address output from said logic circuit are assigned to higher order bits of said block select address in said memory macro.

2. The semiconductor memory device according to claim 1, wherein said higher order bits of said block select address output from said logic circuit includes a bank address specifying a bank to be selected among a plurality of banks and said address connection line is interconnected such that in said memory macro, said bank address is assigned to said higher order bits of said block select address.

3. The semiconductor memory device according to claim 2, wherein each of said plurality of banks further includes a spare word line for substituting for a defective word line and said defective word line is replaced with said spare word line in a bank where said defective word line is present.

4. The semiconductor memory device according to claim 1, wherein said higher order bits of said block select address output from said logic circuit includes a bank address specifying a bank to be selected among a plurality of banks and said address connection line is interconnected such that in said memory macro, said bank address is assigned to said lower order bits of said block select address.

5. The semiconductor memory device according to claim 4, wherein each of said plurality of memory blocks further includes a spare word line for substituting for a defective word line and said defective word line is replaced with said spare word line in a memory block where said defective word line is present.

* * * * *